United States Patent
Eom et al.

(10) Patent No.: US 9,331,080 B2
(45) Date of Patent: May 3, 2016

(54) SEMICONDUCTOR DEVICE HAVING CONTACT PLUG AND METHOD OF FORMING THE SAME

(71) Applicants: Dail Eom, Goyang-si (KR); Sunjung Lee, Hwaseong-si (KR); Junghun Choi, Seoul (KR)

(72) Inventors: Dail Eom, Goyang-si (KR); Sunjung Lee, Hwaseong-si (KR); Junghun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/714,711

(22) Filed: May 18, 2015

(65) Prior Publication Data
US 2016/0086950 A1   Mar. 24, 2016

(30) Foreign Application Priority Data

Sep. 23, 2014  (KR) .................. 10-2014-0127083

(51) Int. Cl.
| | |
|---|---|
| *H01L 27/092* | (2006.01) |
| *H01L 29/78* | (2006.01) |
| *H01L 29/08* | (2006.01) |
| *H01L 29/417* | (2006.01) |
| *H01L 29/36* | (2006.01) |
| *H01L 23/528* | (2006.01) |
| *H01L 29/45* | (2006.01) |

(52) U.S. Cl.
CPC .......... *H01L 27/0924* (2013.01); *H01L 23/528* (2013.01); *H01L 29/0847* (2013.01); *H01L 29/36* (2013.01); *H01L 29/41791* (2013.01); *H01L 29/45* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,039,843 B2 | 10/2011 | Inaba | |
| 8,476,706 B1 | 7/2013 | Chidambarrao et al. | |
| 2011/0068407 A1 | 3/2011 | Yeh et al. | |
| 2013/0248999 A1 | 9/2013 | Glass et al. | |
| 2013/0285155 A1* | 10/2013 | Glass | ............ H01L 29/0847 257/369 |
| 2013/0292777 A1* | 11/2013 | Liaw | .................. G11C 11/412 257/369 |

FOREIGN PATENT DOCUMENTS

KR   20090083671 A  *  8/2009  ............ H01L 21/768

\* cited by examiner

*Primary Examiner* — Joseph Schoenholtz

(74) *Attorney, Agent, or Firm* — Harness, Dickey & Pierce, P.L.C.

(57) ABSTRACT

A semiconductor device includes an N-type fin and a P-type fin on a substrate, a first gate electrode configured to cross the N-type fin and cover a side surface of the N-type fin, a second gate electrode configured to cross the P-type fin and cover a side surface of the P-type fin, a first source/drain on the N-type fin adjacent to the first gate electrode, a second source/drain on the P-type fin adjacent to the second gate electrode, a buffer layer on a surface of the second source/drain and including a material different from the second source/drain, an interlayer insulating layer on the buffer layer and the first source/drain, a first plug connected to the first source/drain and passing through the interlayer insulating layer, and a second plug connected to the second source/drain and passing through the interlayer insulating layer and the buffer layer.

20 Claims, 25 Drawing Sheets

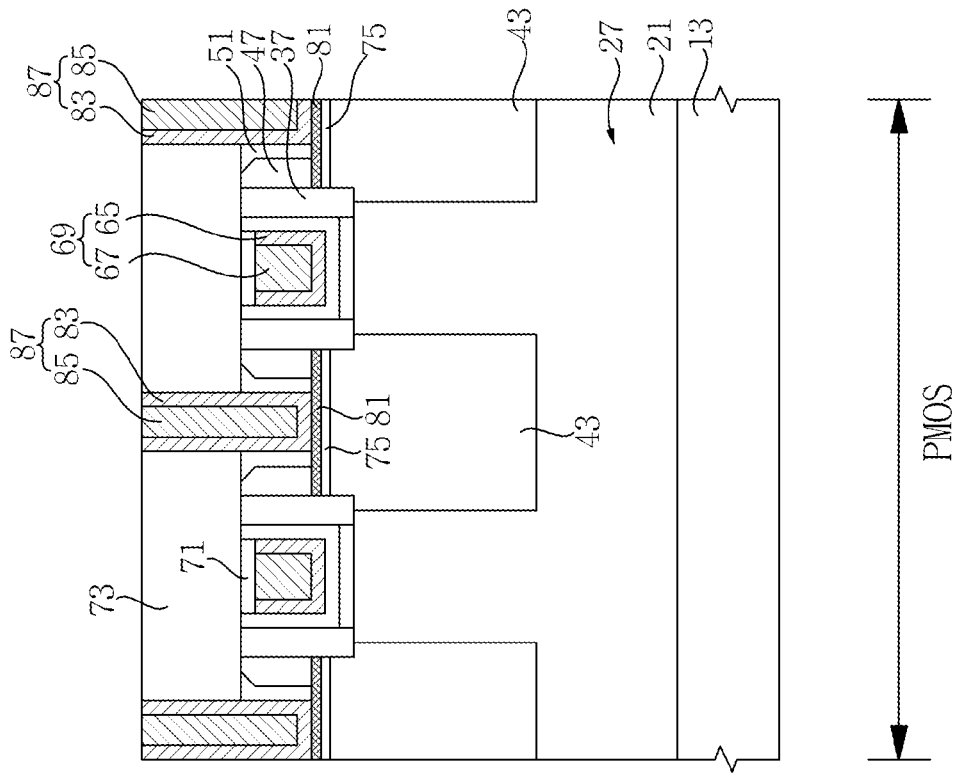
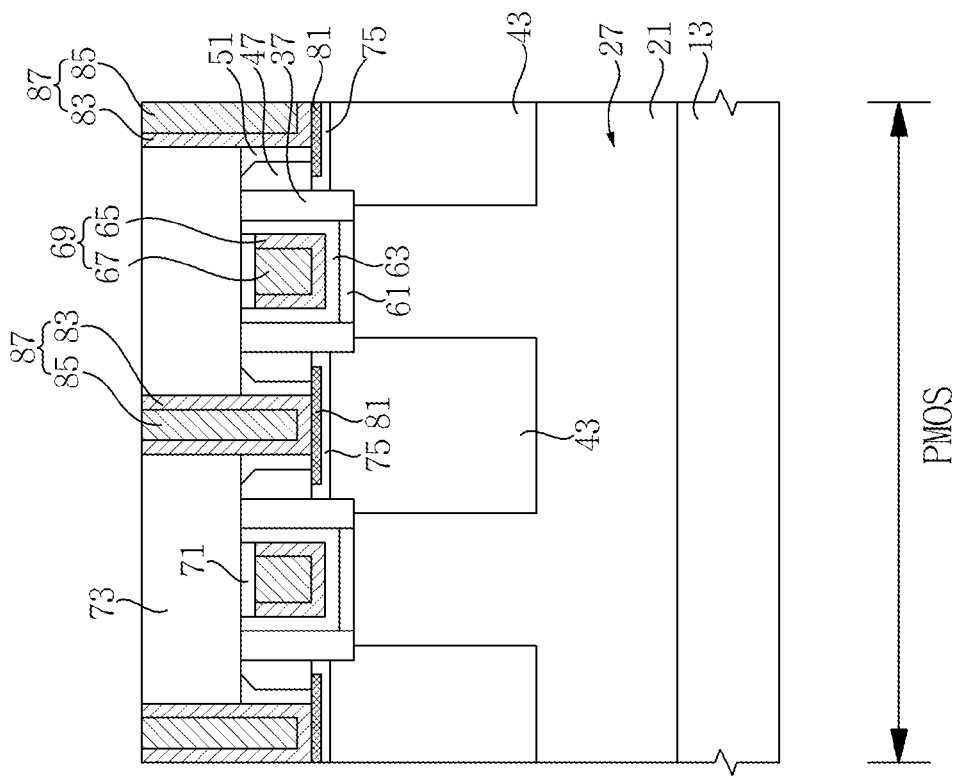

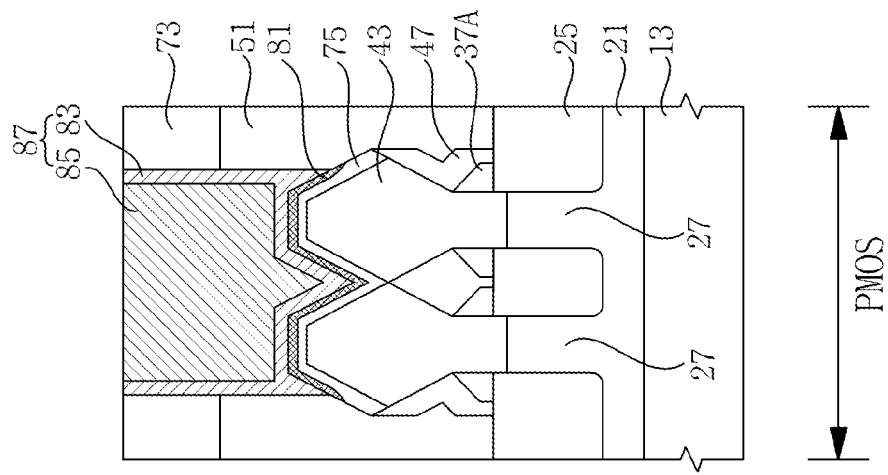
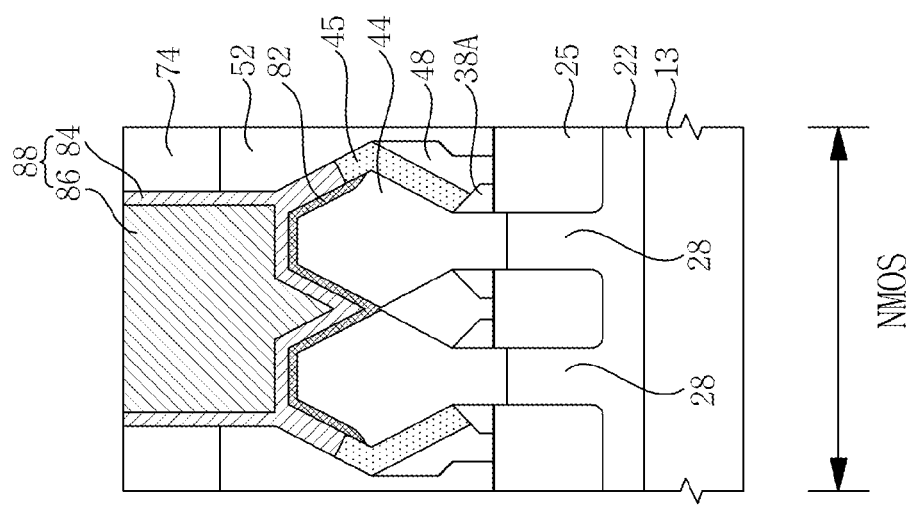

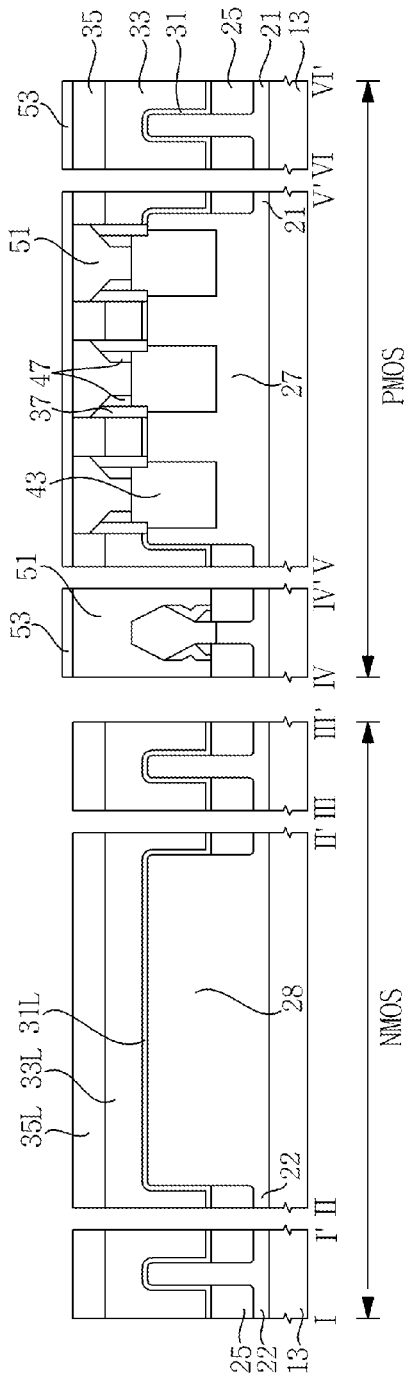
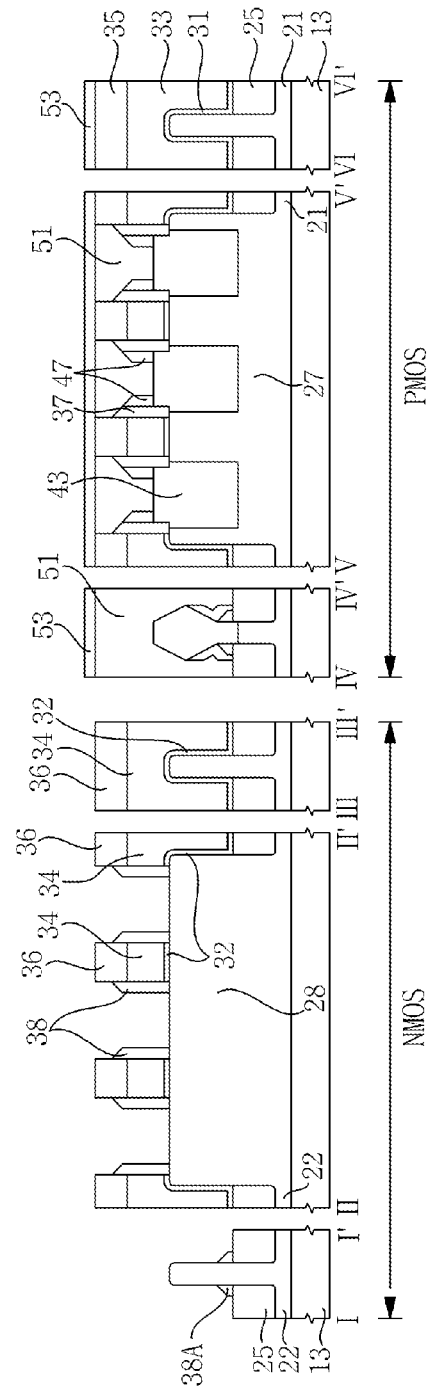

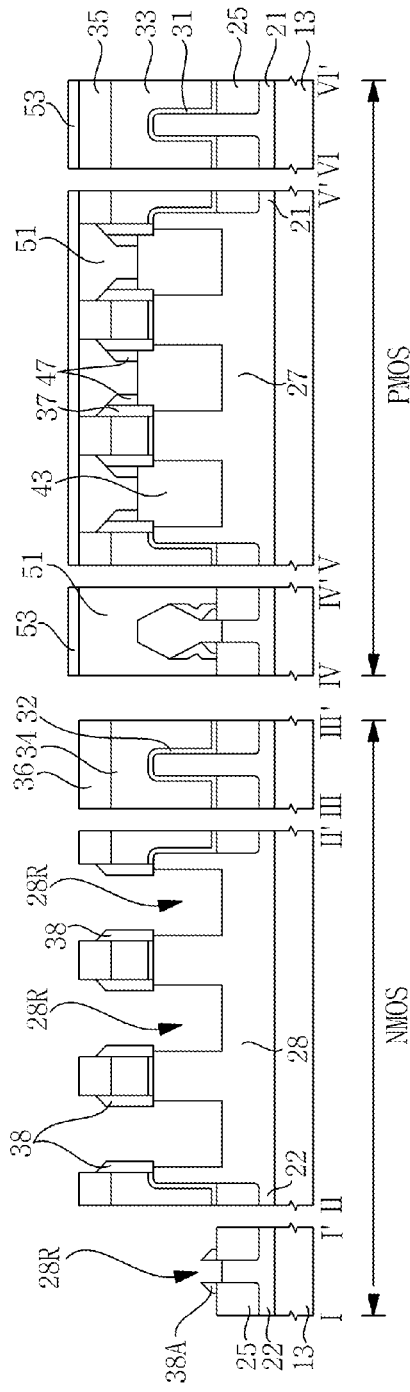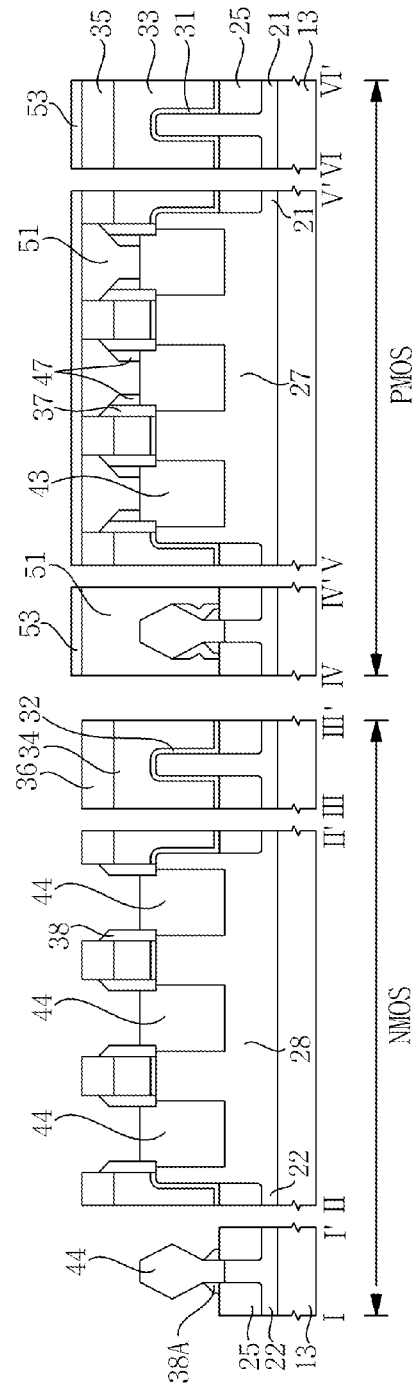

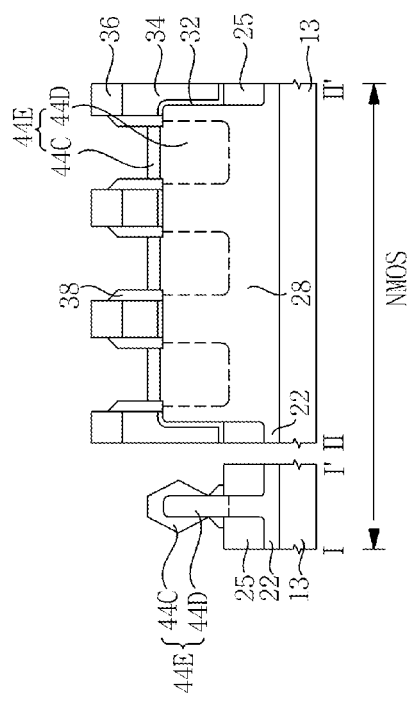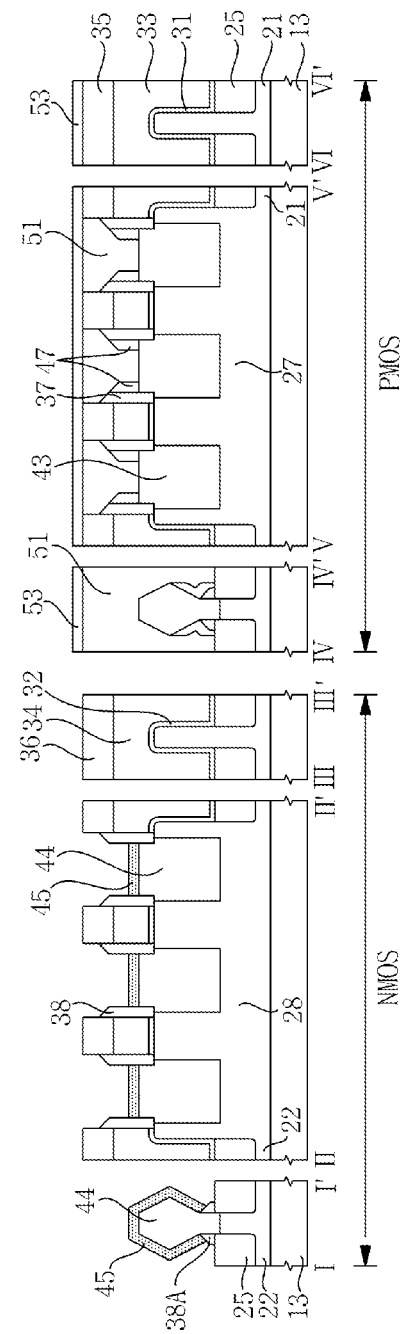

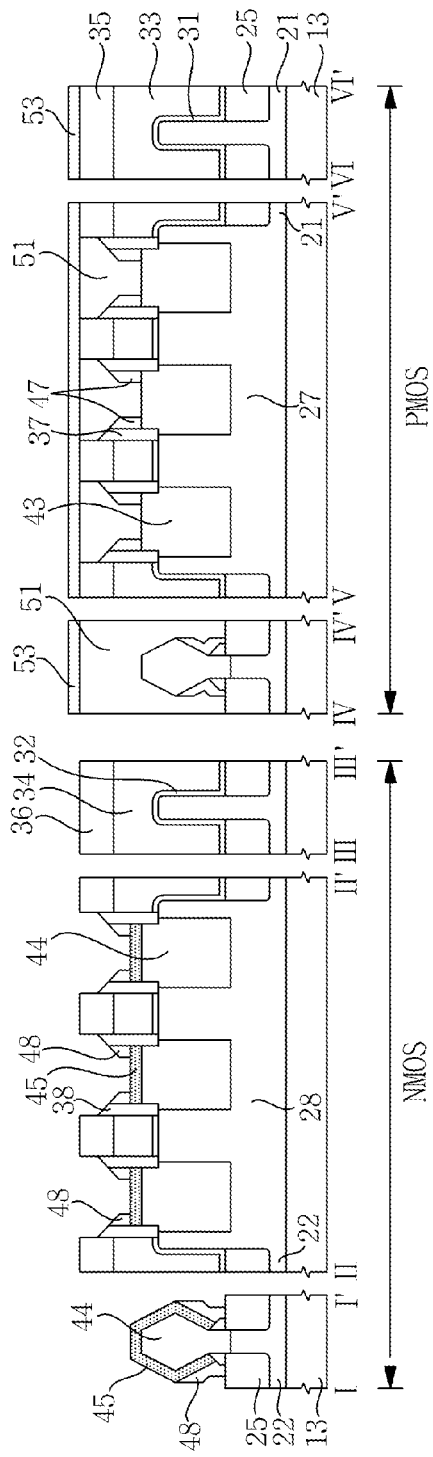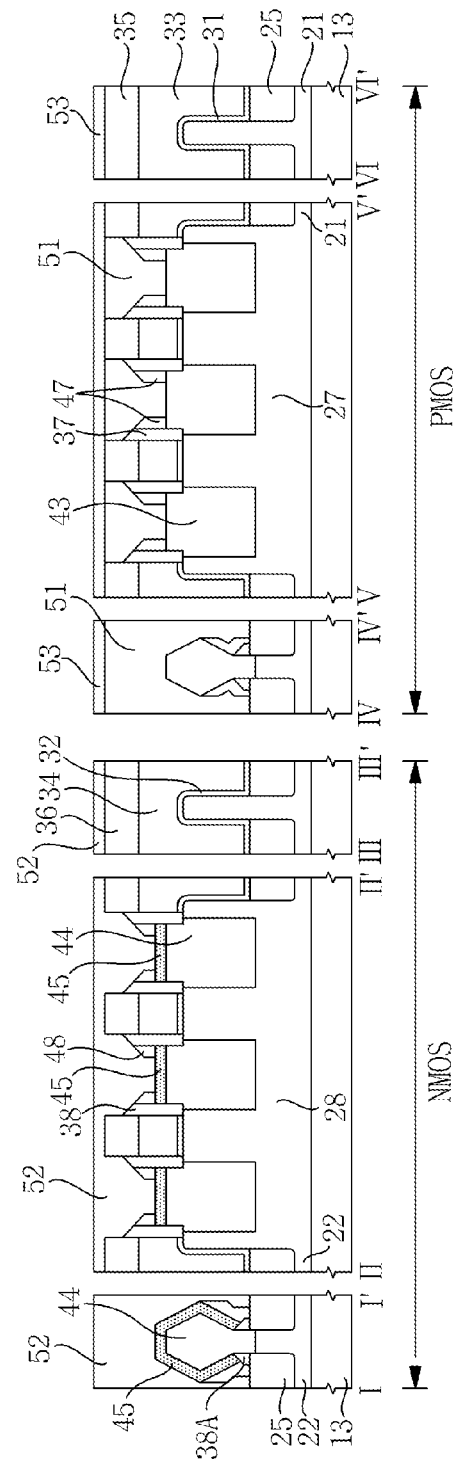

SEMICONDUCTOR DEVICE HAVING CONTACT PLUG AND METHOD OF FORMING THE SAME

CROSS-REFERENCE TO RELATED APPLICATION

This application claims priority under 35 U.S.C. §119 to Korean Patent Application No. 10-2014-0127083 filed on Sep. 23, 2014, the disclosure of which is hereby incorporated by reference in its entirety.

BACKGROUND

1. Field

Some example embodiments of the inventive concepts relate to a semiconductor device having a low-resistance contact plug.

2. Description of Related Art

Various methods of reducing a contact resistance in a semiconductor device having an NMOS region and a PMOS region have been studied. A technique using a plug ion implantation method has been tried in order to reduce a contact resistance. A plurality of contact holes are formed on an NMOS region and a PMOS region, and B or P may be implanted through the plurality of contact holes. In the case of doping with B, it may be effective in reducing a contact resistance of the PMOS region but may increase the contact resistance of the NMOS region. In the case of doping with P, it may be effective in reducing the contact resistance of the NMOS region but may increase a contact resistance of the PMOS region.

SUMMARY

Some example embodiments of the inventive concepts provide a semiconductor device having a low-resistance contact plug.

Other example embodiments of the inventive concepts provide a method of forming a semiconductor device having a low-resistance contact plug while simplifying a process.

Various example embodiments of the inventive concepts are not limited to the above-mentioned example embodiments; other example embodiments which are not mentioned may be clearly understood by those of ordinary skill in the art based on the following descriptions.

According to an example embodiment of the inventive concepts, a semiconductor device includes an N-type fin and a P-type fin on a substrate, a first gate electrode configured to cross the N-type fin and cover a side surface of the N-type fin, a second gate electrode configured to cross the P-type fin and cover a side surface of the P-type fin, a first source/drain on the N-type fin adjacent to the first gate electrode, a second source/drain on the P-type fin adjacent to the second gate electrode, a buffer layer on a surface of the second source/drain and including a material different from the second source/drain, an interlayer insulating layer on the buffer layer and the first source/drain, a first plug connected to the first source/drain and passing through the interlayer insulating layer, and a second plug connected to the second source/drain and passing through the interlayer insulating layer and the buffer layer.

In an example embodiment, a center portion of the second source/drain may have a horizontal width greater than a horizontal width of a lower portion. The buffer layer may directly contact the lower portion of the second source/drain.

In an example embodiment, the buffer layer may include a crystal growth material.

In an example embodiment, the buffer layer may include Ge.

In an example embodiment, the device may further include a plug ion implantation region between the first source/drain and the first plug. A P-type impurity concentration in the plug ion implantation region may be greater than that in the first source/drain.

In an example embodiment, the buffer layer may have a thickness greater than the plug ion implantation region.

In an example embodiment, a thickness of the buffer layer is 3 nm or more, and may be smaller than a thickness of the interlayer insulating layer.

In an example embodiment, the first source/drain may include at least one of silicon germanium (SiGe), silicon (Si), boron (B) and boron monofluoride (BF). The second source/drain may include at least one of silicon carbide (SiC), silicon (Si), phosphorus (P) and arsenic (As).

In an example embodiment, a lower portion of the second plug may have a horizontal width greater than a horizontal width of a center portion.

In an example embodiment, the device may further include an under-cut region under the interlayer insulating layer. The second plug may extend into the under-cut region and contact the buffer layer.

In an example embodiment, a first metal silicide layer may be between the first plug and the first source/drain and a second metal silicide layer may be between the second plug and the second source/drain.

According to another example embodiment of the inventive concepts, a semiconductor device includes a first fin on a substrate and having a first conductivity type, a first gate electrode configured to cross the first fin and cover a side surface of the first fin, a first source/drain on the first fin and adjacent to the first gate electrode, the first source/drain having a second conductivity type different from the first conductivity type, a buffer layer on a surface of the first source/drain and including a material different from the first source/drain, an interlayer insulating layer on the buffer layer, a first plug connected to the first source/drain and passing through the interlayer insulating layer and the buffer layer.

In another example embodiment, the device may further include a second fin spaced apart from the first fin on the substrate and having the second conductivity type, a second gate electrode configured to cross the second fin and cover a side surface of the second fin, a second source/drain on the second fin and adjacent to the second gate electrode, the second source/drain having the first conductivity type, and a second plug connected to the second source/drain and passing through the interlayer insulating layer. The interlayer insulating layer may be on the second source/drain.

In another example embodiment, a plug ion implantation region may be between the second source/drain and the second plug.

In another example embodiment, the buffer layer may have a thickness greater than the plug ion implantation region.

In another example embodiment, the buffer layer may include germanium (Ge).

According to still another example embodiment of the inventive concepts, a semiconductor device includes a plurality of fins on a substrate and in parallel, the plurality of first fins having a first conductivity type, a first gate electrode configured to cross the first fins and cover side surfaces of the first fins, first source/drains on the first fins and adjacent to the first gate electrode, the first source/drains having a second conductivity type different from the first conductivity type, a buffer layer on a surface of the first source/drains, the buffer layer including a material different from the first source/drains, an interlayer insulating layer on the buffer layer, and a first plug connected to the first source/drains and passing through the interlayer insulating layer and the buffer layer.

In still another example embodiment, the device may further include a plurality of second fins spaced apart from the first fins on the substrate and in parallel, the second fins having the second conductivity type, a second gate electrode configured to cross the second fins and cover side surfaces of the second fins, second source/drains on the second fins and adjacent to the second gate electrode, the second source/drains having the first conductivity type, and a second plug connected to the second source/drains and passing through the interlayer insulating layer. The interlayer insulating layer may be on the second source/drains.

In still another example embodiment, the device may further include a plug ion implantation region between the second source/drains and the second plug.

In still another example embodiment, the buffer layer may have a thickness greater than the plug ion implantation region.

According to yet another example embodiment of the inventive concepts, a method of forming a semiconductor device includes forming a first fin having a first conductivity type and a second fin having a second conductivity type on a substrate, forming a first gate electrode configured to cross the first fin and cover a side surface of the first fin, forming a second gate electrode configured to cross the second fin and cover a side surface of the second fin, forming a first source/drain on the first fin and adjacent to the first gate electrode, the first source/drain having a second conductivity type different from the first conductivity type, forming a second source/drain on the second fin and adjacent to the second gate electrode, the second source/drain having the first conductivity type, forming a buffer layer on a surface of the second source/drain and including a material different from the second source/drain, forming an interlayer insulating layer on the buffer layer and the first source/drain, forming a first plug connected to the first source/drain and passing through the interlayer insulating layer and forming a second plug connected to the second source/drain and passing through the interlayer insulating layer and the buffer layer.

In yet another example embodiment, forming the first plug may further include forming a first contact hole configured to pass through the interlayer insulating layer and expose the first source/drain and implanting impurities having the second conductivity type into the first source/drain to form a plug ion implantation region, and forming the second plug may further include forming a second contact hole configured to pass through the interlayer insulating layer and expose the buffer layer, and removing the buffer layer exposed by the second contact hole to expose the second source/drain.

In yet another example embodiment, the buffer layer may have a thickness greater than the plug ion implantation region.

In yet another example embodiment, the buffer layer may inhibit the impurities having the second conductivity type from implanting into the second source/drain.

In yet another example embodiment, a center portion of the second source/drain may have a horizontal width greater than a horizontal width of a lower portion, and the buffer layer may directly contact the lower portion of the second source/drain.

In yet another example embodiment, the buffer layer may include a crystal growth material.

In yet another example embodiment, the buffer layer may include Ge.

In yet another example embodiment, an under-cut region may be formed under the interlayer insulating layer, and the second plug may extend into the under-cut region and contact the buffer layer.

In yet another example embodiment, a lower portion of the second plug may have a horizontal width greater than a horizontal width of a center portion.

In yet another example embodiment, a first metal silicide layer may be formed between the first plug and the first source/drain, and a second metal silicide layer may be formed between the second plug and the second source/drain.

In yet another example embodiment, the first source/drain may include at least one of silicon germanium (SiGe), silicon (Si), boron (B) and boron monofluoride (BF). The second source/drain may include at least one of silicon carbide (SiC), silicon (Si), phosphorus (P) and arsenic (As).

Detailed items of the other example embodiments of the inventive concepts are included in the detailed descriptions and the accompanying drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 3 to 22 are cross-sectional views illustrating a semiconductor device in accordance with an example embodiment of the inventive concepts;

FIGS. 23 to 49 are cross-sectional views illustrating a method of forming a semiconductor device in accordance with an example embodiment of the inventive concepts.

DETAILED DESCRIPTION

Figure 1:
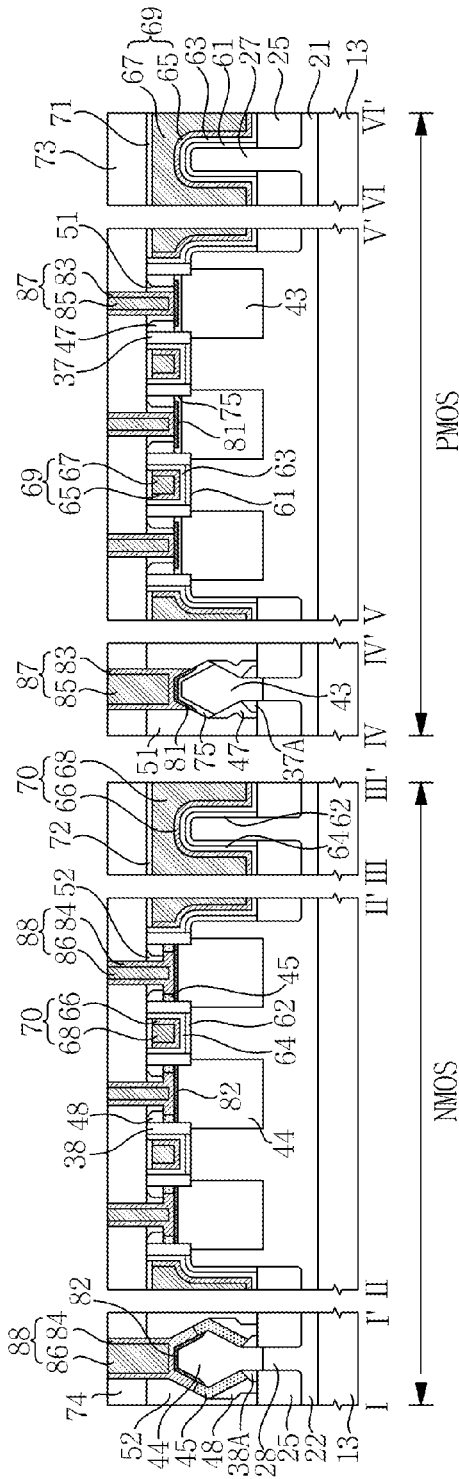
FIG. 1 is a cross-sectional view illustrating a semiconductor device in accordance with an example embodiment of the inventive concepts.

Advantages and features of the inventive concepts and method of achieving them will be made apparent with reference to the accompanying figures and the example embodiments to be described below in detail. However, these inventive concepts should not be limited to the example embodiments set forth herein and may be construed as various embodiments in different forms. Rather, these example embodiments are provided so that disclosure of the inventive concepts is thorough and complete, and fully conveys the inventive concepts to those of ordinary skill in the art. The inventive concepts are defined by the appended claims.

The terminology used herein is only intended to describe example embodiments of the inventive concepts and not intended to limit the scope of the inventive concepts. As used herein, the singular forms "a," "an," and "the" are intended to include the plural forms as well, unless specifically indicated otherwise. The terms "comprises", "includes", "including" and/or "comprising" that are used herein specify the presence of mentioned elements, steps, operations, and/or devices, but do not preclude the presence or addition of one or more of other elements, steps, operations, and/or devices.

When one element (elements) is (are) referred to as "connected" or "coupled" to other element(s), this may indicate directly connected or coupled to the elements(s), or intervening elements may be present. On the other hand, when one element referred to as "directly connected (directly connected to)" or "directly coupled (directly coupled to)" other element(s), there are no intervening element(s). Throughout the entire specification, the same reference numbers refer to the same components. The "and/or" includes each and all combinations of one or more of the items mentioned.

Spatially relative terms, such as "below," "beneath," "lower," "above," "upper," and the like, may be used herein to easily describe the correlation between one device or elements and another device or other elements as illustrated in the figures. The spatially relative terms should be understood as the terms that include different orientations of the device in additional usage or operation of the orientations illustrated in figures. For example, when the device illustrated in the figures is turned over, the device described as disposed "below" or "beneath" another device may be disposed "above" the other device. Accordingly, the exemplary term "below" or "beneath" may include orientations of both below and above. The device may be oriented at other orientations, and the spatially relative terms used herein may be interpreted accordingly.

Further, example embodiments are described herein with reference to cross-sectional views and/or plan views that are idealized schematic views of the inventive concepts. The thicknesses of layers and parts in the figures are overstated for the effective description of technical content. Thus, shapes of the schematic views may vary according to manufacturing techniques and/or tolerances. Therefore, the example embodiments of the inventive concepts are not limited to the particular shapes illustrated herein but are to include deviations in shapes formed in accordance with the manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the inventive concepts.

Like numbers refer to like elements throughout the entire text herein. Thus, the same or similar numbers may be described with reference to other drawings even if those numbers are neither mentioned nor described in the corresponding drawings. Further, elements that are not denoted by reference numbers may be described with reference to other drawings.

In the present specification, relative terms such as "front side" and "back side" are used herein as relative concepts to describe the example embodiments of the inventive concepts for easy understanding. Thus, the terms "front side" and "back side" do not necessarily indicate specific directions, locations, or elements but can be used interchangeably. For example, a term "front side" may be interpreted as a term "back side," and a term "back side" may be interpreted as a term "front side." Accordingly, the term "front side" may be expressed as a term "first side," and a term "back side" may be expressed as a term "second side." Conversely, a term "back side" may be expressed as a term "first side," and a term "front side" may be expressed as a term "second side." However, the terms "front side" and "back side" are not used in the same sense in one example embodiment.

In the present specification, a term such as "near" used herein indicates that any one of at least two elements having symmetrical concepts is disposed nearer to another specific element than the others thereof. For example, the expression such as a first end is close to a first side may be inferred as the first end is closer to the first side than a second end, or the first end is closer to the first side than a second side.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
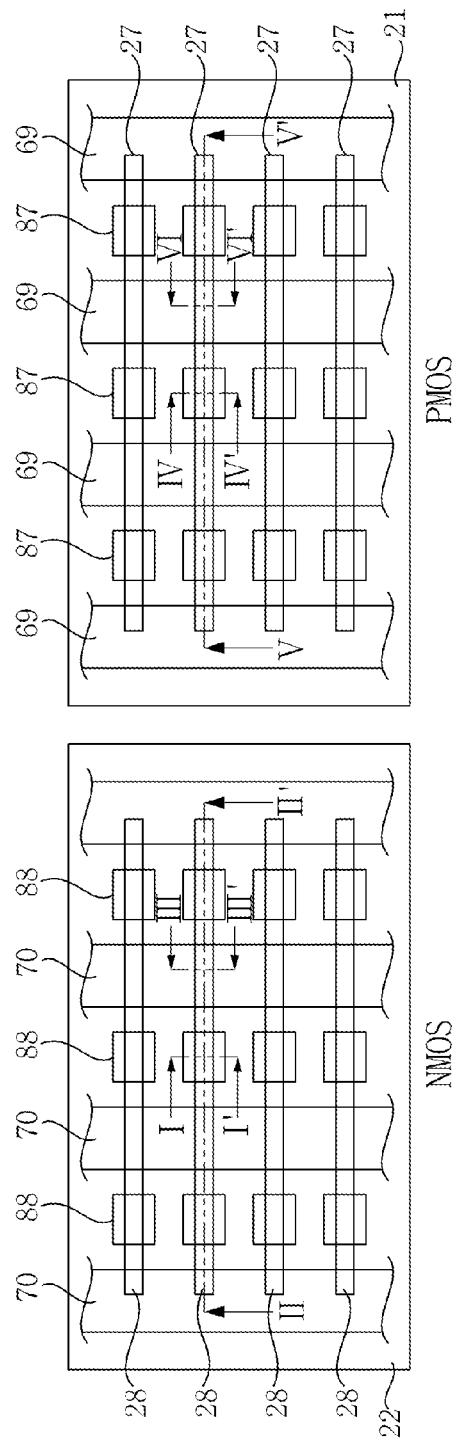
FIG. 2 is a layout illustrating a semiconductor device in accordance with an example embodiment of the inventive concepts.

FIG. 1 is a cross-sectional view illustrating a semiconductor device in accordance with an example embodiment of the inventive concepts, and FIG. 2 is a layout. FIG. 1 is a cross-sectional view taken along lines I-I', II-II', III-III', IV-IV', V-V', and VI-VI' of FIG. 2.

Referring to FIG. 1, a semiconductor device in accordance with the example embodiment of the inventive concepts may include an N-well 21, a P-well 22, a device isolation layer 25, an N-type fin 27, a P-type fin 28, a first inner spacer 37, a second inner spacer 38, a first lower spacer 37A, a second lower spacer 38A, a first source/drain 43, a second source/drain 44, a buffer layer 45, a first outer spacer 47, a second outer spacer 48, a first lower insulating layer 51, a second lower insulating layer 52, a first lower gate dielectric layer 61, a second lower gate dielectric layer 62, a first upper gate dielectric layer 63, a second upper gate dielectric layer 64, a first gate electrode 69 including a first lower gate electrode 65 and a first upper gate electrode 67, a second gate electrode 70 including a second lower gate electrode 66 and a second upper gate electrode 68, a first gate capping layer 71, a second gate capping layer 72, a first upper insulating layer 73, a second upper insulating layer 74, a first plug ion implantation region 75, a first metal silicide layer 81, a second metal silicide layer 82, a first plug 87 including a first lower conductive layer 83 and a first upper conductive layer 85, a second plug 88 including a second lower conductive layer 84 and a second upper conductive layer 86, which are formed on a semiconductor substrate 13 having an NMOS region and a PMOS region.

The first source/drain 43 may include P-type impurities, and the second source/drain 44 may include N-type impurities. The first plug 87 may be electrically connected to the first source/drain 43 through the first metal silicide layer 81 and the first plug ion implantation region 75. The second plug 88 may pass through the buffer layer 45 and be connected to the second source/drain 44 through the second metal silicide layer 82. The buffer layer 45 may serve to prevent or inhibit the P-type impurities from implanting into the second source/drain 44 while forming the first plug ion implantation region 75. A contact resistance between the first plug 87 and the first source/drain 43 and a contact resistance between the second plug 88 and the second source/drain 44 may be remarkably reduced.

Referring to FIG. 2, the N-well 21 may be formed in the PMOS region of the semiconductor substrate 13. A plurality of N-type fins 27 in parallel may be formed on the N-well 21. A plurality of first gate electrodes 69 configured to cross the N-type fins 27 and to be in parallel may be formed. A plurality of first plugs 87 may be formed on the N-type fins 27 between the first gate electrodes 69.

The P-well 22 may be formed in the NMOS region of the semiconductor substrate 13. A plurality of P-type fins 28 in parallel may be formed on the P-well 22. A plurality of second gate electrodes 70 configured to cross the P-type fins 28 and to be in parallel may be formed. A plurality of second plugs 88 may be formed on the P-type fins 28 between the second gate electrodes 70.

FIGS. 3 to 16 are cross-sectional views illustrating a semiconductor device in accordance with an example embodiment of the inventive concepts.

Figure 3:
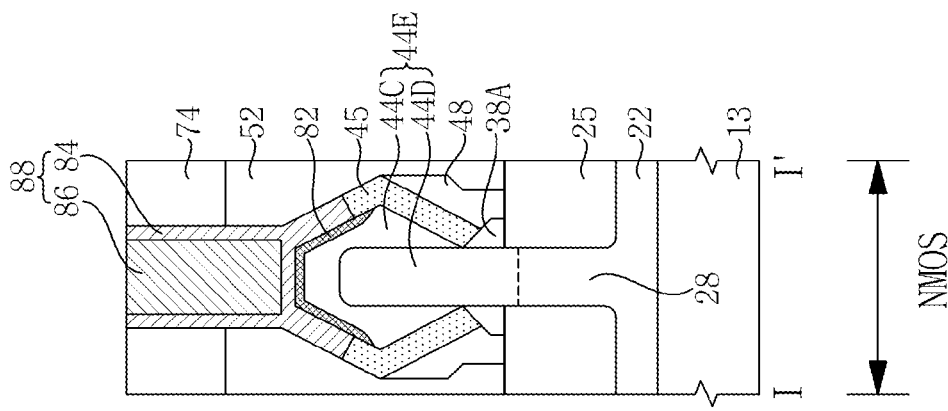

Referring to FIG. 3, a buffer layer 45 may be formed on a second source/drain 44. A second lower insulating layer 52 may be formed on the buffer layer 45. A second upper insulating layer 74 may be formed on the second lower insulating layer 52. A second plug 88 connected to the second source/drain 44 passing through the second upper insulating layer 74 and the second lower insulating layer 52 may be formed. A second metal silicide layer 82 may be formed between the second plug 88 and the second source/drain 44. An under-cut region 52UC may be formed between the second lower insulating layer 52 and the second source/drain 44. The second plug 88 may extend into the under-cut region 52UC. The second plug 88 may have a horizontal width of a lower end greater than a horizontal width of a center.

The second source/drain 44 may include a crystal growth material. The second source/drain 44 may have a horizontal width of a middle portion greater than a horizontal width of a lower portion. A side surface between a lower end and the middle portion of the second source/drain 44 may have a negative slope. The buffer layer 45 may include a crystal growth material. The buffer layer 45 may be defined on the second source/drain 44. The buffer layer 45 may have a thickness greater than a critical thickness which prevents or inhibits stress to the second source/drain 44. For example, a thickness of the buffer layer 45 may be 3 nm or more. The buffer layer 45 may contact a negatively sloped side surface of the second source/drain 44. A side surface between a lower end and a middle portion of the buffer layer 45 may have a negative slope.

Figure 4:
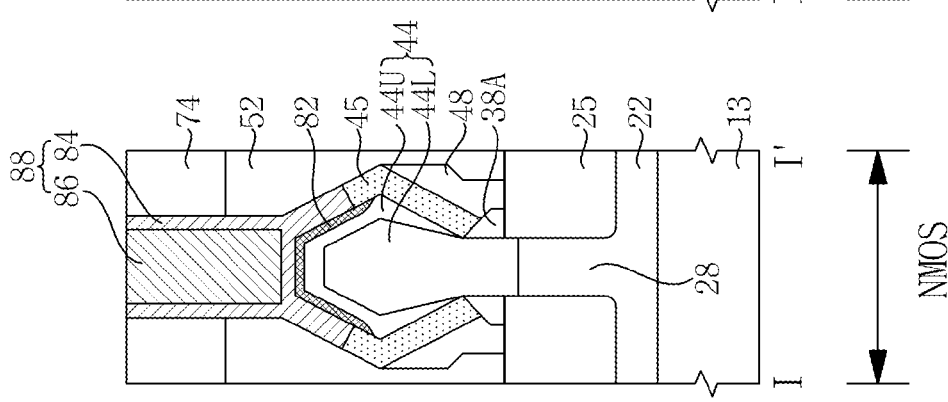

Referring to FIG. 4, a horizontal width of a second plug 88 may be greater than that of a second source/drain 44.

Figure 5:
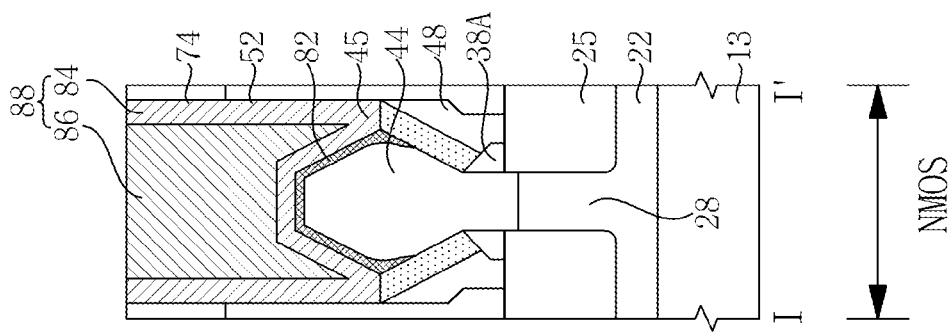

Referring to FIG. 5, a second source/drain 44 may include a second lower semiconductor layer 44L and a second upper semiconductor layer 44U. For example, the second lower semiconductor layer 44L may include a silicon carbide (SiC) layer formed using a selective epitaxial growth (SEG) method. The second upper semiconductor layer 44U may include a Si layer formed using an SEG method.

Figure 6:
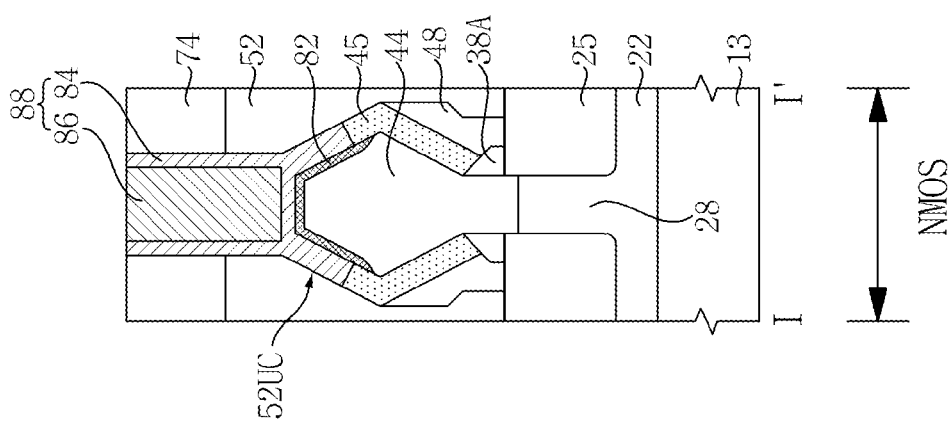

Referring to FIG. 6, a second source/drain 44E may include a second lower semiconductor pattern 44D and a second upper semiconductor layer 44C. The second lower semiconductor pattern 44D may be formed by implanting an N-type impurity into a P-type fin 28. The second upper semiconductor layer 44C may include a Si layer formed using an SEG method on the second lower semiconductor pattern 44D.

Figure 7:
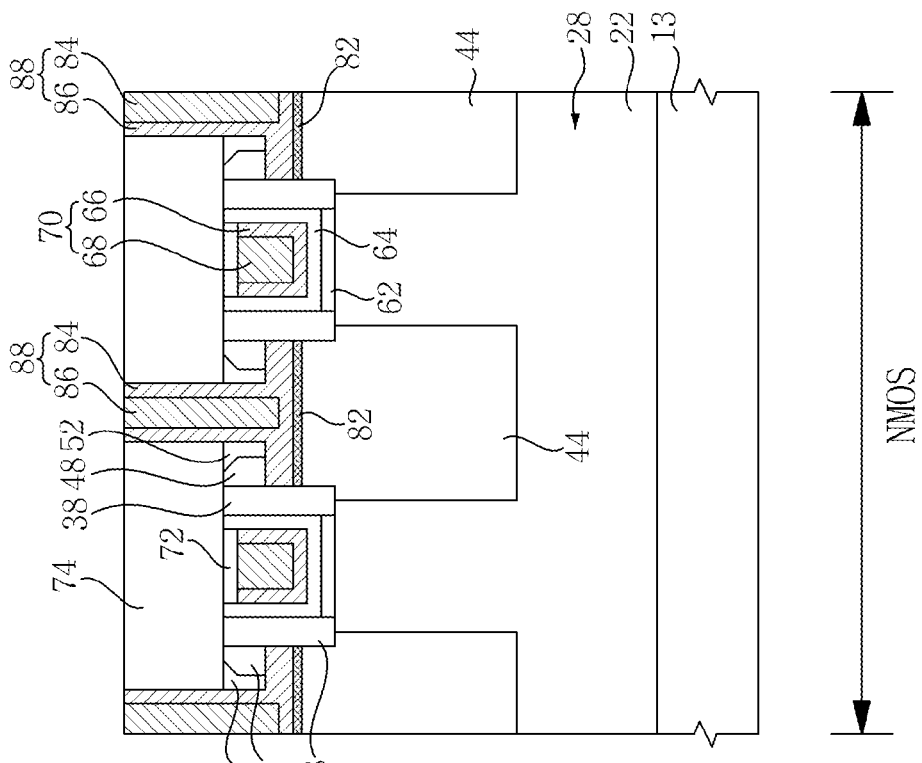

Referring to FIG. 7, an under-cut region 52UC may be formed under a second lower insulating layer 52. A buffer layer 45 may remain between a second outer spacer 48 and a second source/drain 44. A second plug 88 may extend into the under-cut region 52UC. The second plug 88 may have a horizontal width of a lower end greater than a horizontal width of a center. A second metal silicide layer 82 may be formed at a level higher than an upper end of a P-type fin 28.

Figure 8:
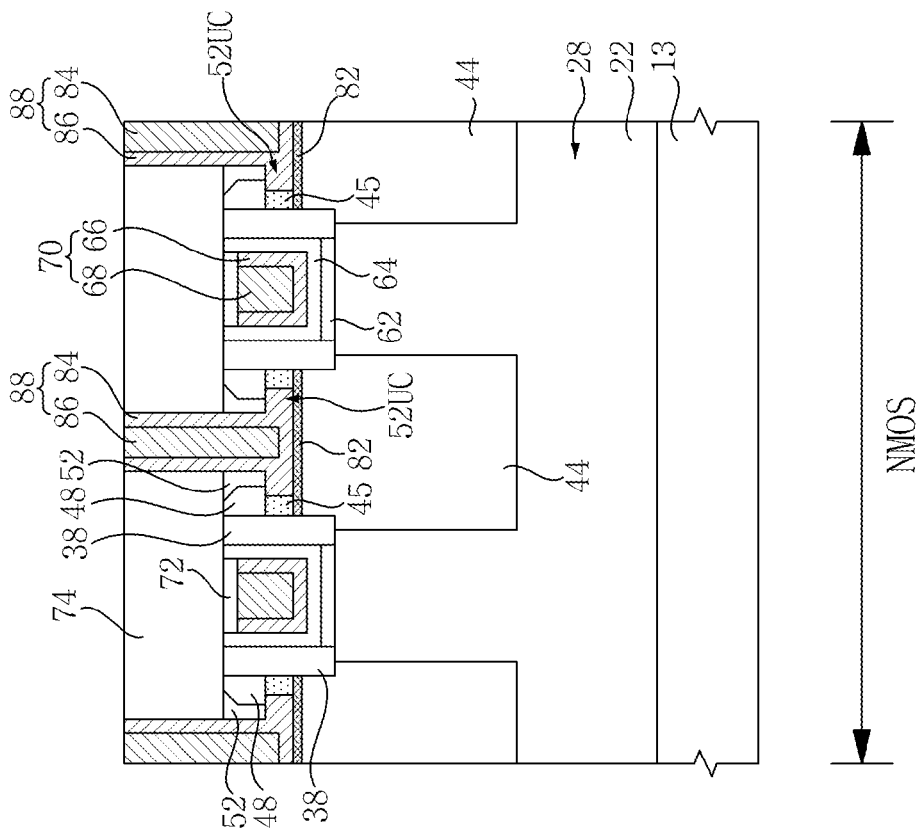

Referring to FIG. 8, a second plug 88 may extend between a second outer spacer 48 and a second source/drain 44. The second plug 88 may directly contact a side surface of a second inner spacer 38.

Figure 9:
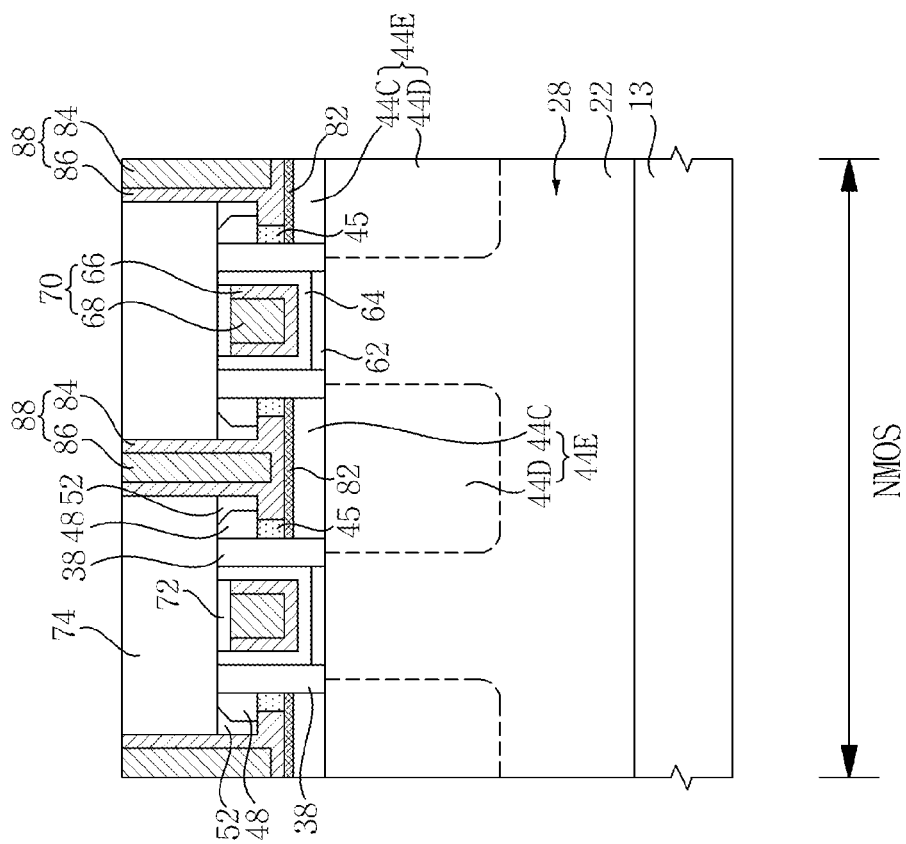

Referring to FIG. 9, a second source/drain 44 may include a second lower semiconductor layer 44L and a second upper semiconductor layer 44U. A second metal silicide layer 82 may be formed on the second upper semiconductor layer 44U.

Figure 10:
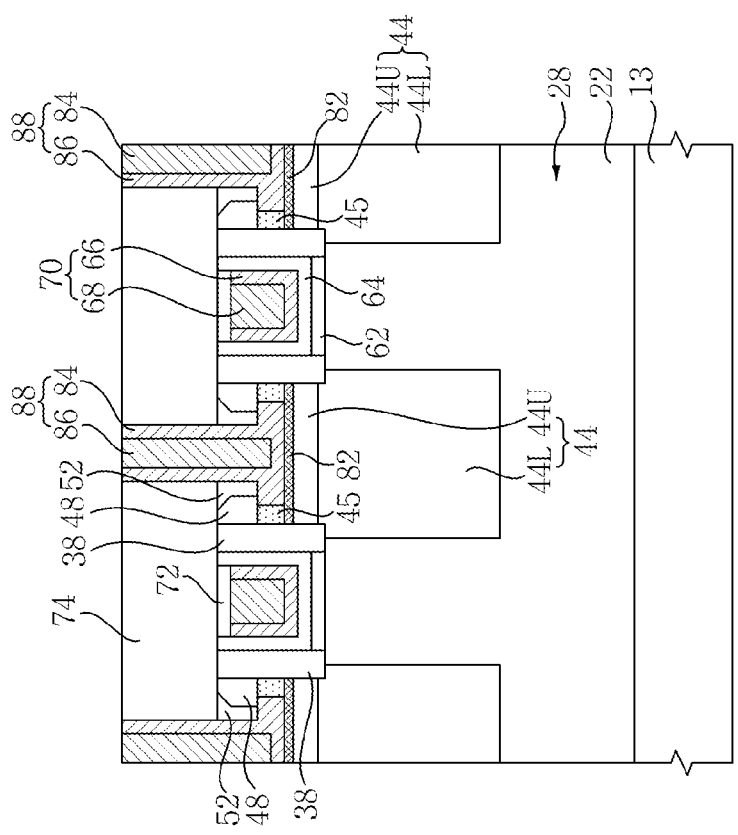

Referring to FIG. 10, a second source/drain 44E may include a second lower semiconductor pattern 44D and a second upper semiconductor layer 44C. A second metal silicide layer 82 may be formed on the second upper semiconductor layer 44C.

Figure 11:
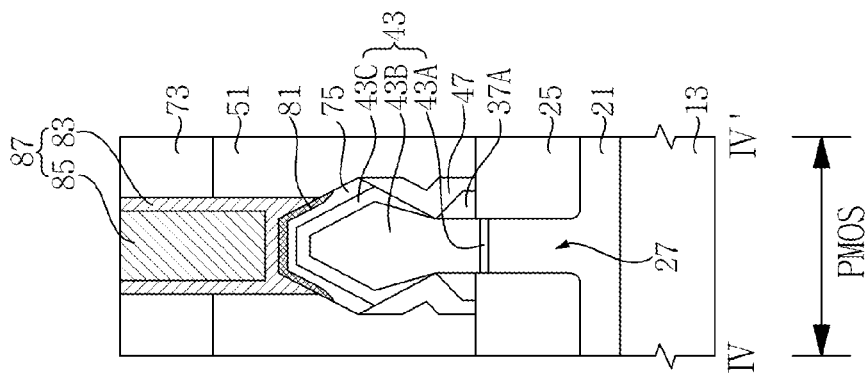

Referring to FIG. 11, a first lower insulating layer 51 may be formed on a first source/drain 43. A first upper insulating layer 73 may be formed on the first lower insulating layer 51. A first plug 87 connected to the first source/drain 43 passing through the first upper insulating layer 73 and the first lower insulating layer 51 may be formed. A first plug ion implantation region 75 may be formed between the first plug 87 and the first source/drain 43. A first metal silicide layer 81 may be formed in the first plug ion implantation region 75. The first metal silicide layer 81 may be formed between the first plug 87 and the first plug ion implantation region 75. A P-type impurity concentration in the first plug ion implantation region 75 may be higher than that in the first source/drain 43.

Figure 12:
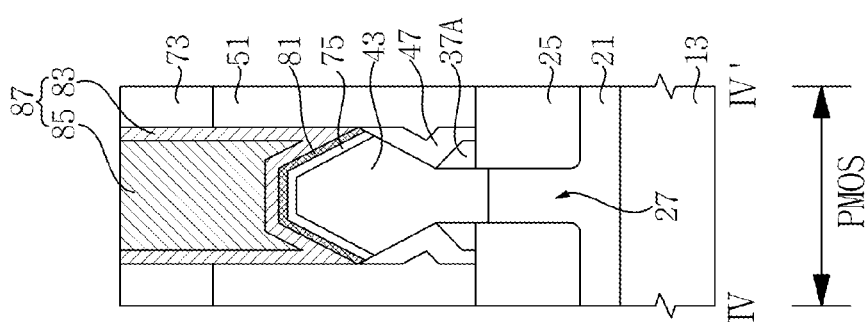

Referring to FIG. 12, a horizontal width of a first plug 87 may be greater than that of the first source/drain 43.

Figure 13:
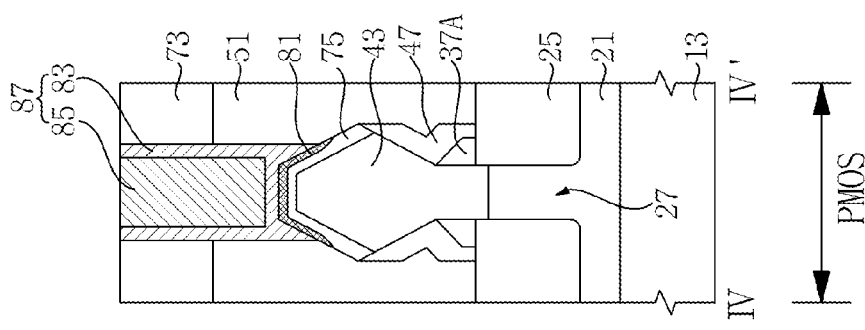

Referring to FIG. 13, a first source/drain 43 may include a first lower semiconductor layer 43A, a first middle semiconductor layer 43B, and a first upper semiconductor layer 43C. A first plug ion implantation region 75 may be formed in the first upper semiconductor layer 43C. A first metal silicide layer 81 may be formed on the first plug ion implantation region 75.

The first lower semiconductor layer 43A may include undoped single-crystalline silicon germanium (SiGe) formed using an SEG method. The first middle semiconductor layer 43B may be formed on the first lower semiconductor layer 43A. The first middle semiconductor layer 43B may include boron (B) doped single-crystalline SiGe formed using a SEG method. The first upper semiconductor layer 43C may be formed on the first middle semiconductor layer 43B. The first upper semiconductor layer 43C may include boron (B) doped single-crystalline Si formed using the SEG method.

Referring to FIG. 14, a first metal silicide layer 81 may be formed in a first plug ion implantation region 75. The first metal silicide layer 81 may be formed between a first plug 87 and the first plug ion implantation region 75. A P-type impurity concentration in the first plug ion implantation region 75 may be higher than that in a first source/drain 43. The first metal silicide layer 81 may be formed at a higher level than an upper end of an N-type fin 27.

Referring to FIG. 15, a first metal silicide layer 81 may extend under a first outer spacer 47. The first metal silicide layer 81 may directly contact a side surface of a first inner spacer 37.

Figure 16:
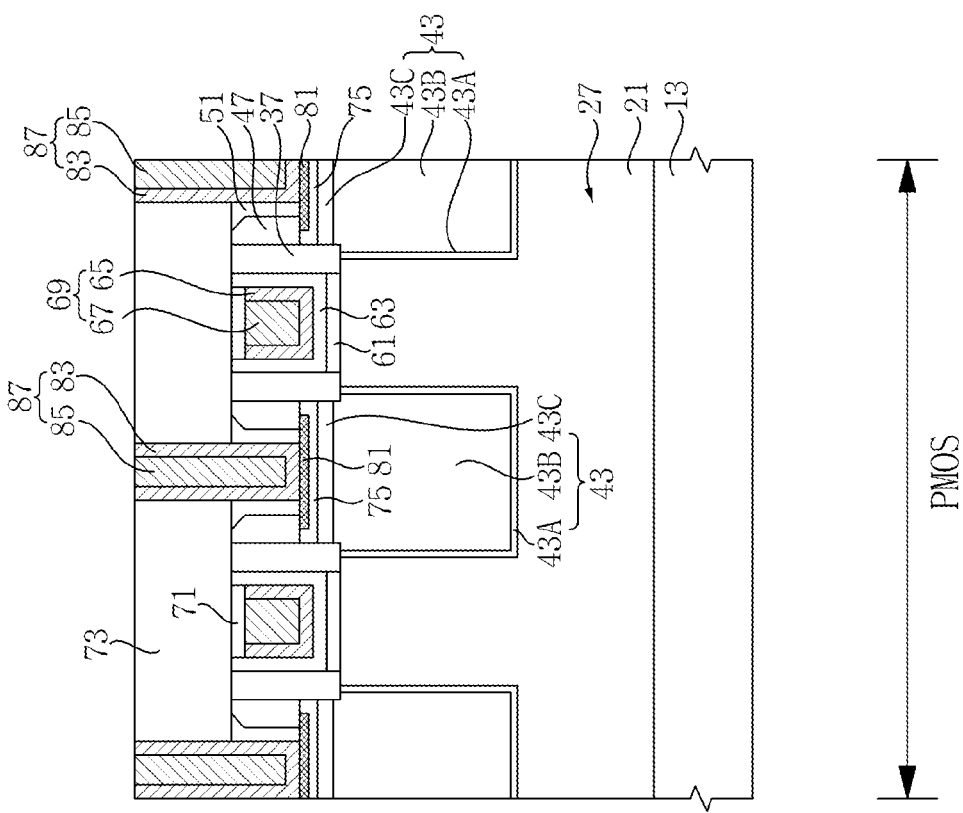

Referring to FIG. 16, a first source/drain 43 may include a first lower semiconductor layer 43A, a first middle semiconductor layer 43B, and a first upper semiconductor layer 43C. A first plug ion implantation region 75 may be formed in the first upper semiconductor layer 43C. A first metal silicide layer 81 may be formed on the first plug ion implantation region 75.

For example, the first lower semiconductor layer 43A may include undoped single-crystalline SiGe formed using an SEG method. The first lower semiconductor layer 43A may contain an amount of Ge in a range of 10 to 25%. The first middle semiconductor layer 43B may be formed on the first lower semiconductor layer 43A. An upper end of the first middle semiconductor layer 43B may protrude at a higher level than an upper end of an N-type fin 27. The first middle semiconductor layer 43B may include boron (B) doped single-crystalline SiGe formed using the SEG method. The first middle semiconductor layer 43B may contain an amount of Ge in a range of 25 to 50%. The first upper semiconductor layer 43C may be formed on the first middle semiconductor layer 43B. The first upper semiconductor layer 43C may include boron (B) doped single-crystalline Si formed using a SEG method.

FIGS. 17 to 22 are cross-sectional views illustrating a semiconductor device in accordance with an example embodiment of the inventive concepts.

Figure 17:
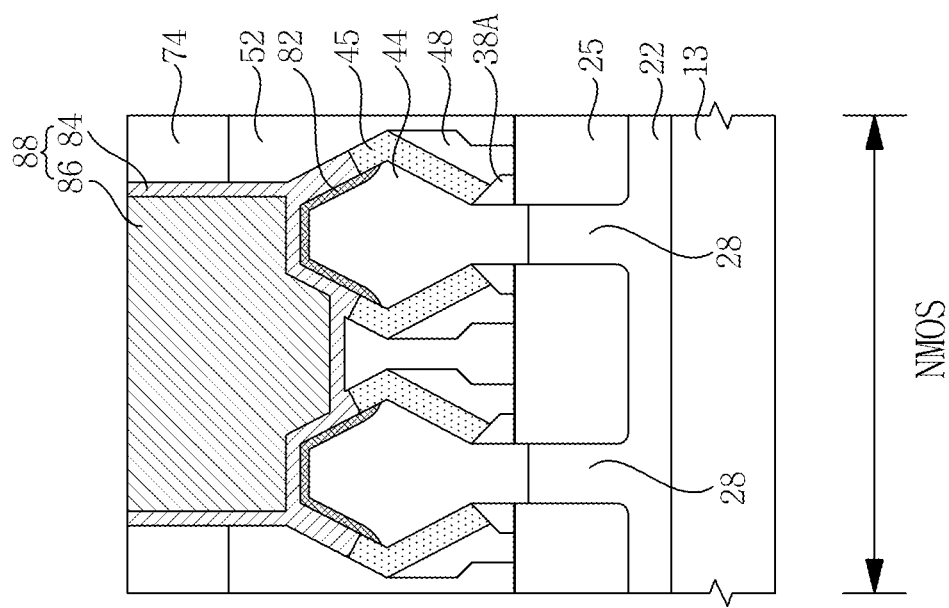

Referring to FIG. 17, a P-well 22 may be formed in an NMOS region of a semiconductor substrate 13. A plurality of P-type fins 28 in parallel may be formed on the P-well 22. Second source/drains 44 may be formed on the P-type fins 28. Buffer layers 45 may be formed on the second source/drains 44. A second lower insulating layer 52 may be formed on the buffer layers 45. A second upper insulating layer 74 may be formed on the second lower insulating layer 52. A second plug 88 connected to the second source/drains 44 passing through the second upper insulating layer 74 and the second lower insulating layer 52 may be formed. Second metal silicide layers 82 may be formed between the second plug 88 and the second source/drains 44.

Figure 18:
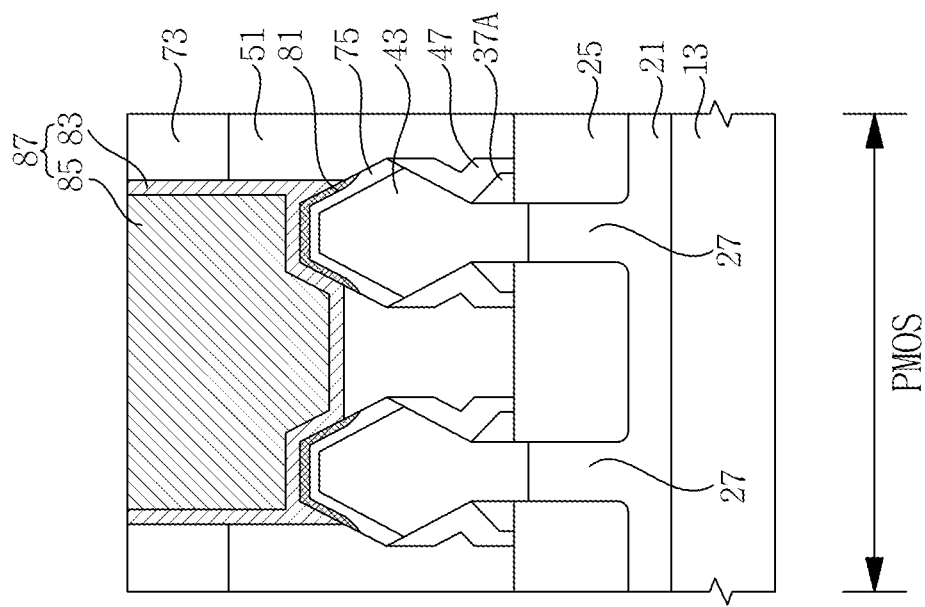

Referring to FIG. 18, an N-well 21 may be formed in a PMOS region of a semiconductor substrate 13. A plurality of N-type fins 27 in parallel may be formed on the N-well 21. First source/drains 43 may be formed on the N-type fins 27. A first lower insulating layer 51 may be formed on the first source/drains 43. A first upper insulating layer 73 may be formed on the first lower insulating layer 51. A first plug 87 connected to the first source/drains 43 passing through the first upper insulating layer 73 and the first lower insulating layer 51 may be formed. First plug ion implantation regions 75 may be formed between the first plug 87 and the first source/drains 43. First metal silicide layers 81 may be formed in the first plug ion implantation regions 75.

Figure 19:
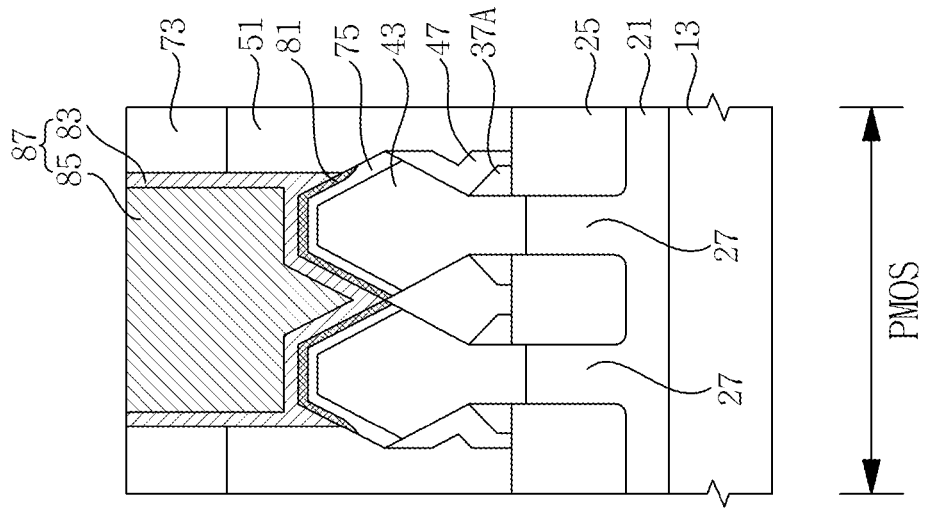

Referring to FIG. 19, buffer layers 45 may contact each other.

Figure 20:
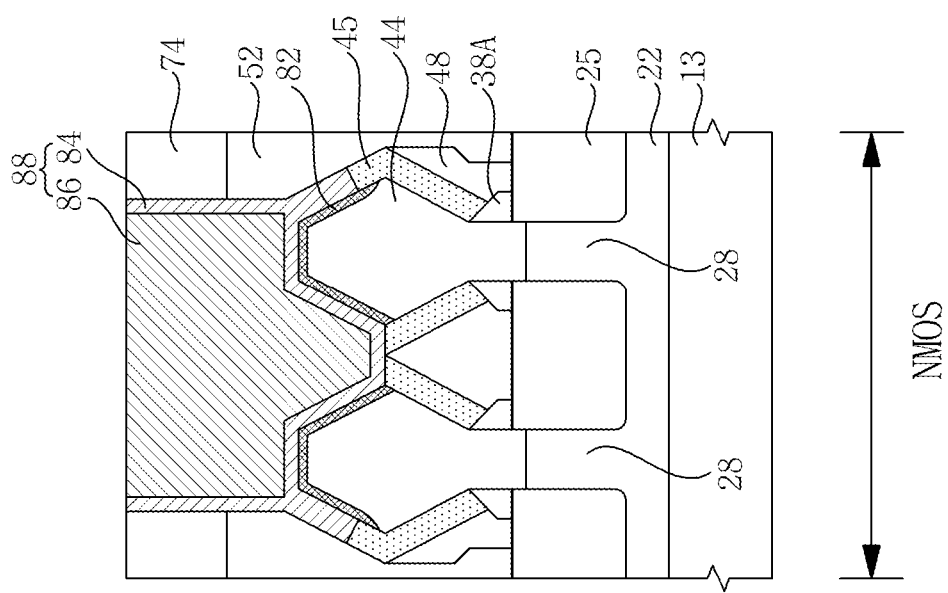

Referring to FIG. 20, first metal silicide layers 81 may contact each other.

Referring to FIG. 21, second source/drains 44 may contact each other. Second metal silicide layers 82 may contact each other.

Referring to FIG. 22, first source/drains 43 may contact each other. First plug ion implantation regions 75 may contact each other. First metal silicide layers 81 may contact each other.

FIGS. 23 to 49 are cross-sectional views taken along lines I-I', II-II', III-III', IV-IV', V-V', and VI-VI' of FIG. 2 to describe a method of forming a semiconductor device in accordance with an example embodiment of the inventive concepts.

Figure 23:
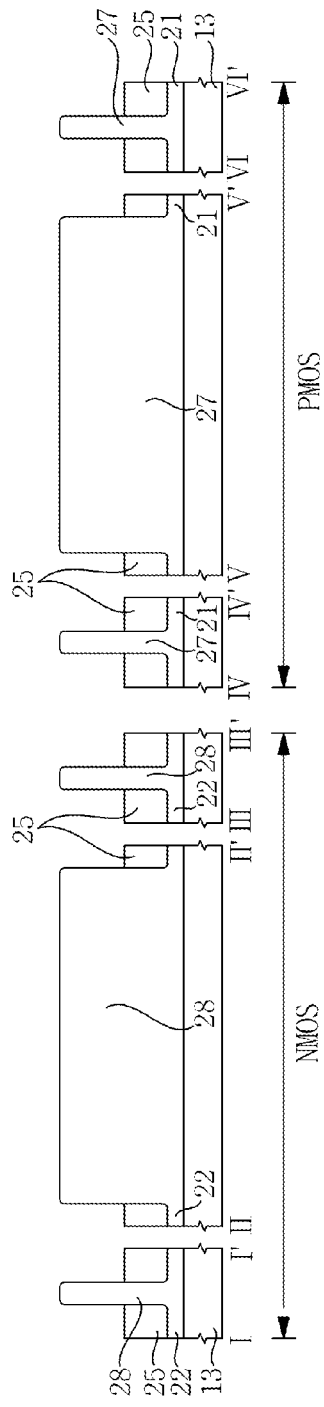

Referring to FIGS. 2 and 23, an N-well 21, a P-well 22, a device isolation layer 25, an N-type fin 27, and a P-type fin 28 may be formed on a semiconductor substrate 13 having an NMOS region and a PMOS region.

The semiconductor substrate 13 may be a bulk wafer or a silicon on insulator (SOI) wafer. For example, the semiconductor substrate 13 may be a single-crystalline silicon wafer having P-type impurities. The N-well 21 may be formed on the PMOS region. The N-well 21 may include N-type impurities. For example, the N-type impurities may include P, As, or a combination thereof. The N-type fin 27 may be defined on the N-well 21 by the device isolation layer 25. The N-type fin 27 may include N-type impurities. For example, the N-type fin 27 may include single-crystalline silicon having the N-type impurities. The N-type fin 27 may have a height greater than a width. An upper end of the N-type fin 27 may protrude at a higher level than the device isolation layer 25. Side surfaces of the N-type fin 27 may be exposed. Upper corners of the N-type fin 27 may be roundly formed.

The P-well 22 may be formed on the NMOS region. The P-well 22 may include P-type impurities. For example, the P-type impurities may include B, BF, BF2, or a combination thereof. The P-type fin 28 may be defined on the P-well 22 by the device isolation layer 25. The P-type fin 28 may include the P-type impurities. For example, the P-type fin 28 may include single-crystalline silicon having the P-type impurities. The P-type fin 28 may have a height greater than a width. An upper end of the P-type fin 28 may protrude at a higher level than the device isolation layer 25. Side surfaces of the P-type fin 28 may be exposed. In another example embodiment, the P-well 22 may be omitted. Upper corners of the P-type fin 28 may be roundly formed.

The device isolation layer 25 may be formed using a shallow trench isolation (STI) technique. The formation of the device isolation layer 25 may include a thin layer forming process, a chemical mechanical polishing (CMP) process, an etch-back process, or a combination thereof. The device isolation layer 25 may include an insulating layer formed of silicon oxide, silicon nitride, silicon oxy-nitride, or a combination thereof. An upper end of the device isolation layer 25 may be formed at a lower level than upper ends of the N-type fin 27 and the P-type fin 28. The device isolation layer 25 may contact the side surfaces of the N-type fin 27 and the P-type fin 28.

Figure 24:
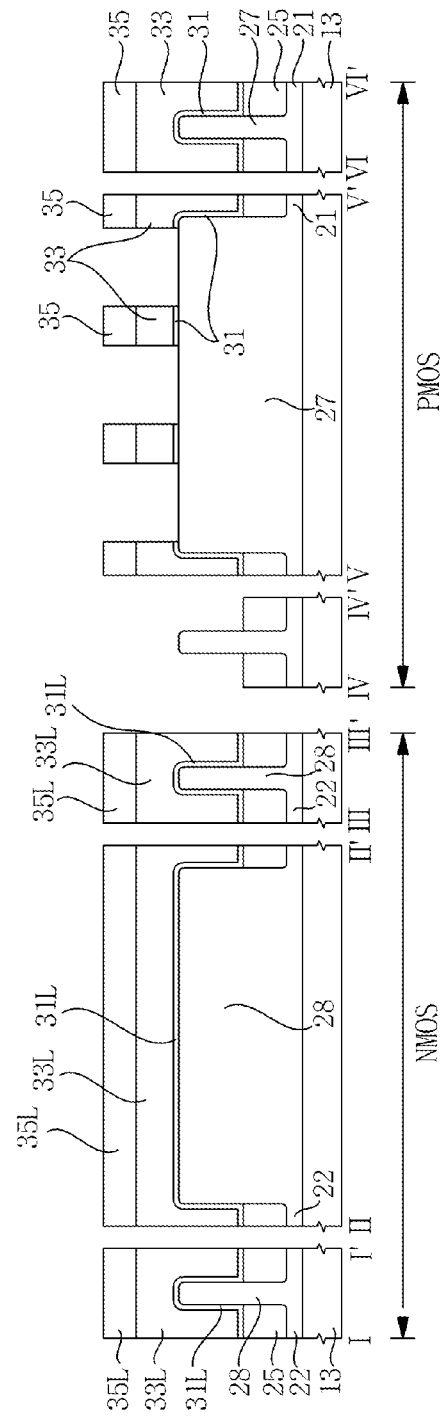

Referring to FIG. 24, a preliminary buffer layer 31L, a preliminary gate layer 33L, and a preliminary capping layer 35L may be sequentially formed on the semiconductor substrate 13. The preliminary buffer layer 31L may include silicon oxide. The preliminary gate layer 33L may include polysilicon. The preliminary capping layer 35L may include silicon oxide, silicon nitride, silicon oxy-nitride, or a combination thereof A first preliminary buffer pattern 31, a first preliminary gate pattern 33, and a first preliminary capping pattern 35 may be formed by patterning the preliminary buffer layer 31L, the preliminary gate layer 33L, and the preliminary capping layer 35L in the PMOS region. The first preliminary gate pattern 33 may cover an upper portion and the side surfaces of the N-type fin 27 and extend onto the device isolation layer 25. The first preliminary buffer pattern 31 may remain between the first preliminary gate pattern 33 and the N-type fin 27.

The preliminary buffer layer 31L, the preliminary gate layer 33L, and the preliminary capping layer 35L may remain in the NMOS region.

Figure 25:
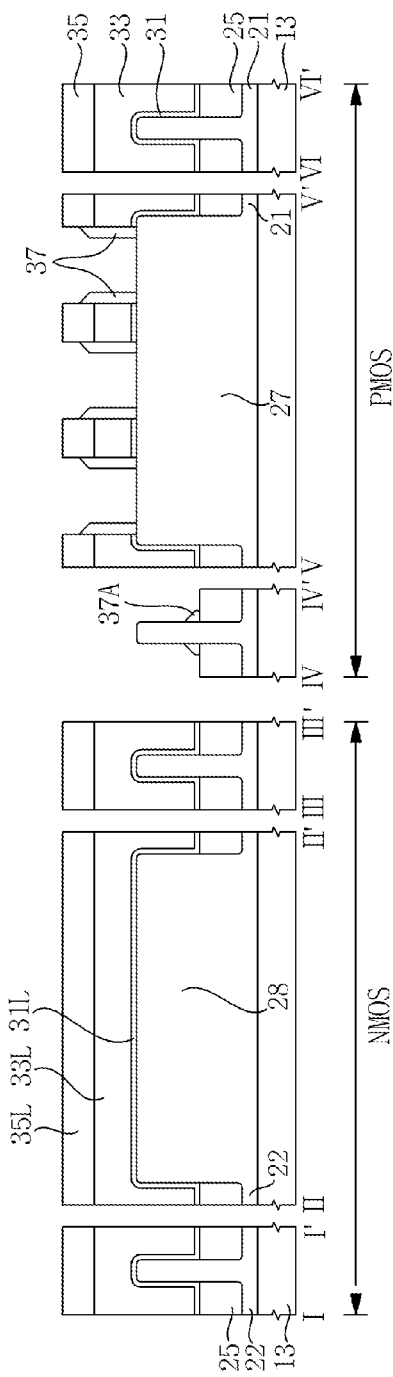

Referring to FIG. 25, first inner spacers 37 may be formed on side surfaces of the first preliminary gate pattern 33. When the first inner spacers 37 are formed, a first lower spacer 37A may be formed on an exposed side surface of the N-type fin 27.

The formation of the first inner spacer 37 may include a thin layer forming process and an anisotropic etching process. The first inner spacer 37 may include an insulating layer formed of silicon oxide, silicon nitride, silicon oxy-nitride, or a combination thereof. For example, the first inner spacer 37 may include silicon nitride. The N-type fin 27 may be exposed to outsides of the first preliminary gate pattern 33 and the first inner spacer 37.

In another example embodiment, the first lower spacer 37A may be removed.

Figure 26:
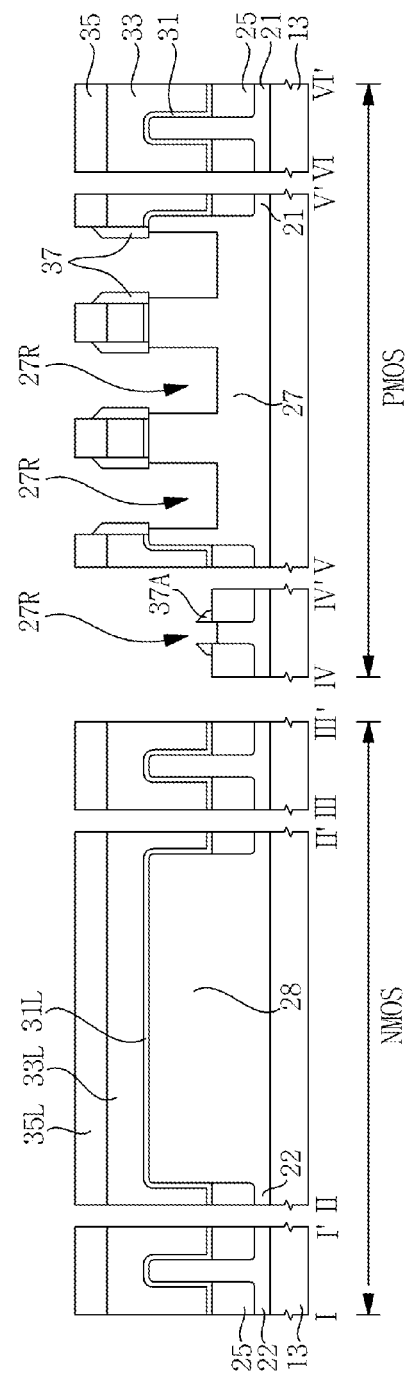

Referring to FIG. 26, a first recessed area 27R may be formed by removing an exposed region of the N-type fin 27.

The formation of the first recessed area 27R may include an anisotropic etching process, an isotropic etching process, a directional etching process, or a combination thereof. The first recessed area 27R may be aligned with an outside of the first inner spacer 37. The first recessed area 27R may expand to a lower portion of the first inner spacer 37. A bottom of the first recessed area 27R may be formed at a lower level than the first lower spacer 37A. The N-type fin 27 may be exposed to sidewalls and the bottom of the first recessed area 27R. A bottom of the first inner spacer 37 may be exposed in the first recessed area 27R.

Figure 27:
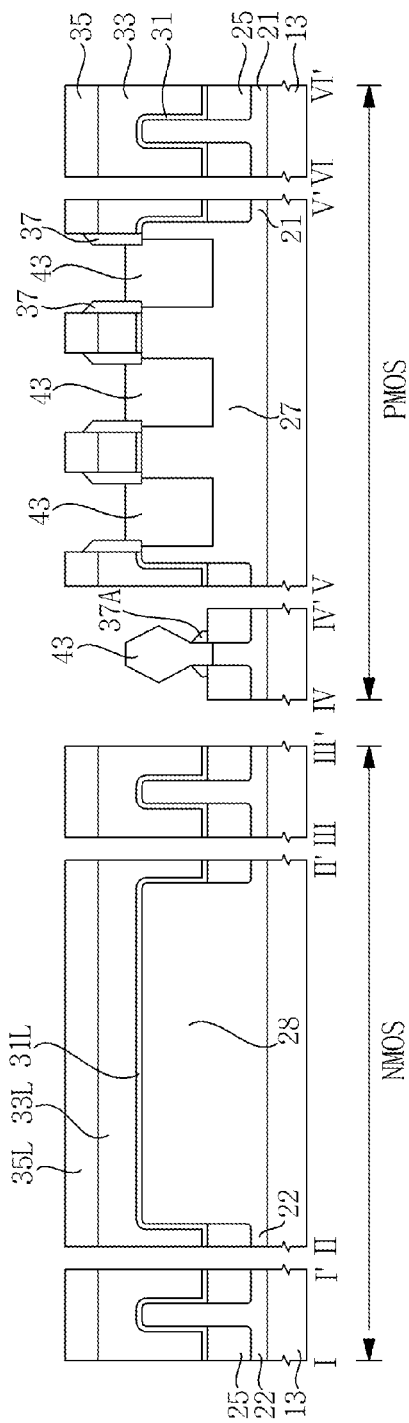

Referring to FIG. 27, a first source/drain 43 may be formed in the first recessed area 27R.

The first source/drain 43 may include a crystal growth material. The first source/drain 43 may include silicon germanium (SiGe), silicon (Si), or a combination thereof. The first source/drain 43 may fill the first recessed area 27R and protrude at a higher level than an upper end of the N-type fin 27. The first source/drain 43 may be referred to as an elevated source/drain. The first source/drain 43 may be interpreted as a stressor. The first source/drain 43 may include P-type impurities. The first source/drain 43 may include B, BF, or a combination thereof.

For example, the first source/drain 43 may include a SiGe layer formed using a SEG method. The first source/drain 43 may have a horizontal width of a middle portion greater than a horizontal width of a lower portion. A side surface between a lower end and a middle portion of the first source/drain 43 may have a negative slope. An upper end of the first source/drain 43 may protrude at a higher level than a lower end of the first inner spacer 37. The upper end of the first source/drain 43 may protrude at a higher level than an upper end of the first lower spacer 37A.

Figure 28:
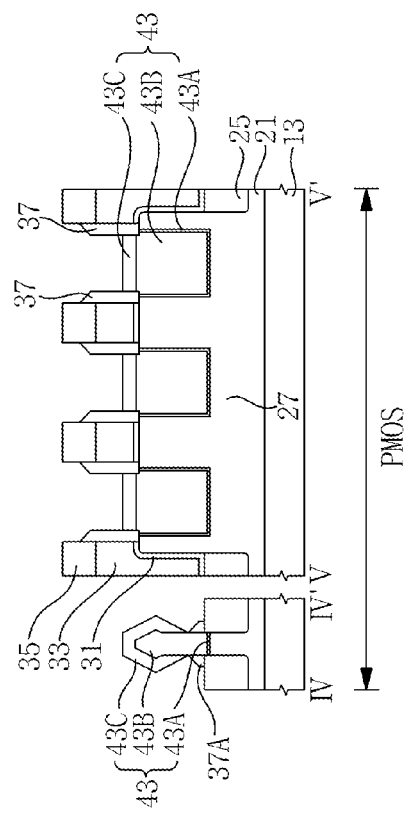

Referring to FIG. 28, in another example embodiment, a first source/drain 43 may include a first lower semiconductor layer 43A, a first middle semiconductor layer 43B, and a first upper semiconductor layer 43C.

For example, the first lower semiconductor layer 43A may include undoped single-crystalline SiGe formed using a SEG method. The first lower semiconductor layer 43A may contain an amount of Ge in a range of 10 to 25%. The first lower semiconductor layer 43A may conformally cover an inner wall of the first recessed area 27R.

The first middle semiconductor layer 43B may be formed on the first lower semiconductor layer 43A. The first middle semiconductor layer 43B may completely fill the first recessed area 27R. An upper end of the first middle semiconductor layer 43B may protrude at a higher level than an upper end of the N-type fin 27. The first middle semiconductor layer 43B may include boron (B) doped single-crystalline SiGe formed by using a SEG method. The first middle semiconductor layer 43B may contain an amount of Ge in a range of 25 to 50%. The first middle semiconductor layer 43B may contain boron (B) in a range of 1E20 to 3E20 atom/cm$^3$.

The first upper semiconductor layer 43C may be formed on the first middle semiconductor layer 43B. The first upper semiconductor layer 43C may include boron (B) doped single-crystalline Si formed using a SEG method. The first upper semiconductor layer 43C may contain boron (B) in a range of 1E20 to 3E20 atom/cm$^3$.

In another example embodiment, the first lower semiconductor layer 43A or the first upper semiconductor layer 43C may be omitted.

Figure 29:
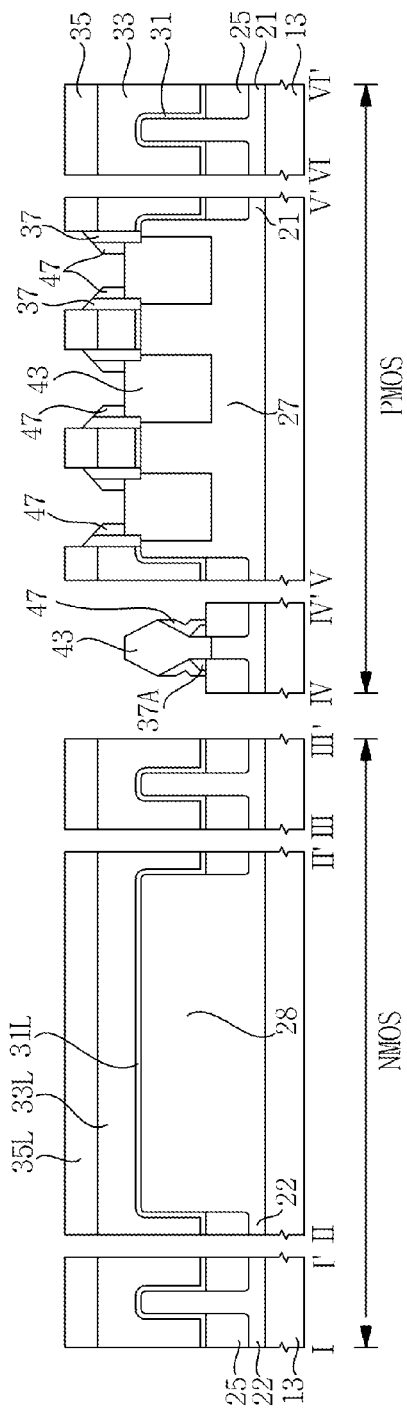

Referring to FIG. 29, a first outer spacer 47 may be formed on a side surface of the first inner spacer 37. The first outer spacer 47 may cover the first lower spacer 37A and partially cover a side surface of the first source/drain 43. A side surface between a lower end and a middle portion of the first source/drain 43 may have a negative slope. A negatively sloped side surface of the first source/drain 43 may be covered by the first outer spacer 47. A bottom of the first outer spacer 47 may contact an upper surface of the first source/drain 43.

The formation of the first outer spacer 47 may include a thin layer forming process and anisotropic etching process. The first outer spacer 47 may include an insulating layer formed of silicon oxide, silicon nitride, silicon oxy-nitride, or a combination thereof. For example, the first outer spacer 47 may include silicon nitride.

Figure 30:
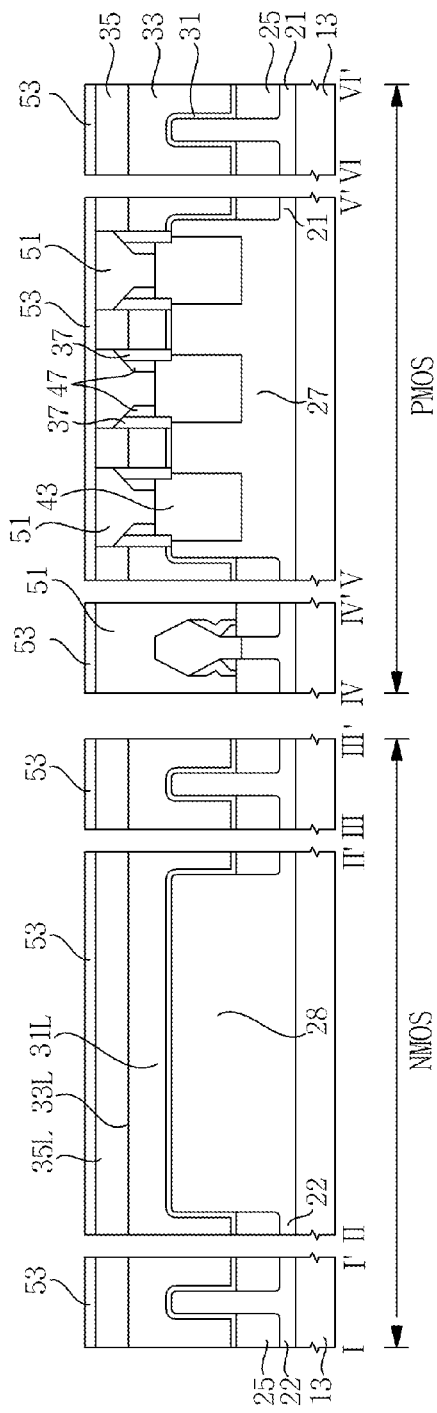

Referring to FIG. 30, the first lower insulating layer 51 may be formed on the first source/drain 43. An etch-stop layer 53 covering an entire surface of the semiconductor substrate 13 may be formed.

The formation of the first lower insulating layer 51 may include a thin layer forming process and a planarization process. The planarization process may include a CMP process, an etch-back process, or a combination thereof. The first lower insulating layer 51 may include an insulating layer formed of silicon oxide, silicon nitride, silicon oxy-nitride, or a combination thereof. For example, the first lower insulating layer 51 may include silicon oxide.

The etch-stop layer 53 may include an insulating layer formed of silicon oxide, silicon nitride, silicon oxy-nitride, or a combination thereof. In another example embodiment, the etch-stop layer 53 may be omitted.

Referring to FIG. 31, the preliminary capping layer 35L may be exposed by removing the etch-stop layer 53 in the NMOS region. The etch-stop layer 53 may remain in the PMOS region.

Referring to FIG. 32, a second preliminary buffer pattern 32, a second preliminary gate pattern 34, and a second preliminary capping pattern 36 may be formed by patterning the preliminary buffer layer 31L, the preliminary gate layer 33L, and the preliminary capping layer 35L in the NMOS region. The second preliminary gate pattern 34 may cover an upper portion and a side surface of the P-type fin 28 and extend onto the device isolation layer 25. The second preliminary buffer pattern 32 may remain between the second preliminary gate pattern 34 and the P-type fin 28.

Second inner spacers 38 may be formed on side surfaces of the second preliminary gate pattern 34. When the second inner spacers 38 are formed, a second lower spacer 38A may be formed on an exposed side surface of the P-type fin 28.

The formation of the second inner spacer 38 may include a thin layer forming process and anisotropic etching process. The second inner spacer 38 may include an insulating layer formed of silicon oxide, silicon nitride, silicon oxy-nitride, or a combination thereof. For example, the second inner spacer 38 may include silicon nitride. The P-type fin 28 may be exposed to outsides of the second preliminary gate pattern 34 and the second inner spacer 38.

In another example embodiment, the second lower spacer 38A may be removed.

Referring to FIG. 33, a second recessed area 28R may be formed by removing an exposed region of the P-type fin 28.

The formation of the second recessed area 28R may include an anisotropic etching process, an isotropic etching process, a directional etching process, or a combination thereof. The second recessed area 28R may be aligned with an outside of the second inner spacer 38. The second recessed area 28R may expand to a lower portion of the second inner spacer 38. A bottom of the second recessed area 28R may be formed at a lower level than the second lower spacer 38A. The P-type fin 28 may be exposed to sidewalls and the bottom of the second recessed area 28R. A bottom of the second inner spacer 38 may be exposed in the second recessed area 28R.

Referring to FIG. 34, a second source/drain 44 may be formed in the second recessed area 28R.

The second source/drain 44 may include a crystal growth material. The second source/drain 44 may include silicon carbide (SiC), silicon (Si), or a combination thereof. The second source/drain 44 may fill the second recessed area 28R and protrude at a higher level than an upper end of the P-type fin 28. The second source/drain 44 may be referred to as an elevated source/drain. The second source/drain 44 may be interpreted as a stressor. The second source/drain 44 may include N-type impurities. The second source/drain 44 may include P, As, or a combination thereof.

For example, the second source/drain 44 may include a silicon carbide (SiC) layer formed using a SEG method. The second source/drain 44 may have a horizontal width of a middle portion greater than a horizontal width of a lower portion. A side surface between a lower end and a middle portion of the second source/drain 44 may have a negative slope. An upper end of the second source/drain 44 may protrude at a higher level than a lower end of the second inner spacer 38. The upper end of the second source/drain 44 may protrude at a higher level than an upper end of the second lower spacer 38A.

Referring to FIG. 35, in another example embodiment, a second source/drain 44E may include a second lower semiconductor pattern 44D and a second upper semiconductor layer 44C.

The second lower semiconductor pattern 44D may be formed by implanting an N-type impurity into the P-type fin 28. The second upper semiconductor layer 44C may be formed on the second lower semiconductor pattern 44D using a SEG method. The second upper semiconductor layer 44C may include a Si layer. The second upper semiconductor layer 44C may include N-type impurities.

Referring to FIG. 36, a buffer layer 45 may be formed on the second source/drain 44. The buffer layer 45 may be defined on the second source/drain 44. The buffer layer 45 may be self-aligned on the second source/drain 44. The buffer layer 45 may directly contact an upper surface and a side surface of the second source/drain 44. The buffer layer 45 may directly contact a side surface of the second inner spacer 38.

The buffer layer 45 may include a crystal growth material. The buffer layer 45 may include a material having an etch selectivity with respect to a material included in a surface of the first source/drain 43. The buffer layer 45 may include a material having an etch selectivity with respect to a material included in a surface of the second source/drain 44. The buffer layer 45 may include a material different from a material included in surfaces of the first source/drain 43 and the second source/drain 44. The buffer layer 45 may be formed along a surface of the second source/drain 44 by using a SEG method. For example, the buffer layer 45 may include a Ge layer, or a SiGe layer. The buffer layer 45 may have a thickness greater than a critical thickness which prevents or inhibits stress to the second source/drain 44. For example, a thickness of the buffer layer 45 may be 3 nm or more. The thickness of the buffer layer 45 may be in a range of 3 to 20 nm.

Referring to FIG. 37, a second outer spacer 48 may be formed on a side surface of the second inner spacer 38. The second outer spacer 48 may cover the second lower spacer 38A and partially cover a side surface of the buffer layer 45.

A side surface between a lower end and a middle portion of the buffer layer 45 may have a negative slope. A negatively sloped side surface of the buffer layer 45 may be covered by the second outer spacer 48. A bottom of the second outer spacer 48 may contact an upper surface of the buffer layer 45.

The formation of the second outer spacer 48 may include a thin layer forming process and an anisotropic etching process. The second outer spacer 48 may include an insulating layer formed of silicon oxide, silicon nitride, silicon oxy-nitride, or a combination thereof. For example, the second outer spacer 48 may include silicon nitride. The upper surface of the buffer layer 45 may be exposed to an outside of the second outer spacer 48.

Referring to FIG. 38, a second lower insulating layer 52 may be formed on the buffer layer 45. The formation of the second lower insulating layer 52 may include a thin layer forming process and a planarization process. The planarization process may include a CMP process, an etch-back process, or a combination thereof. The second lower insulating layer 52 may include an insulating layer formed of silicon oxide, silicon nitride, silicon oxy-nitride, or a combination thereof. For example, the second lower insulating layer 52 may include silicon oxide.

Figure 39:
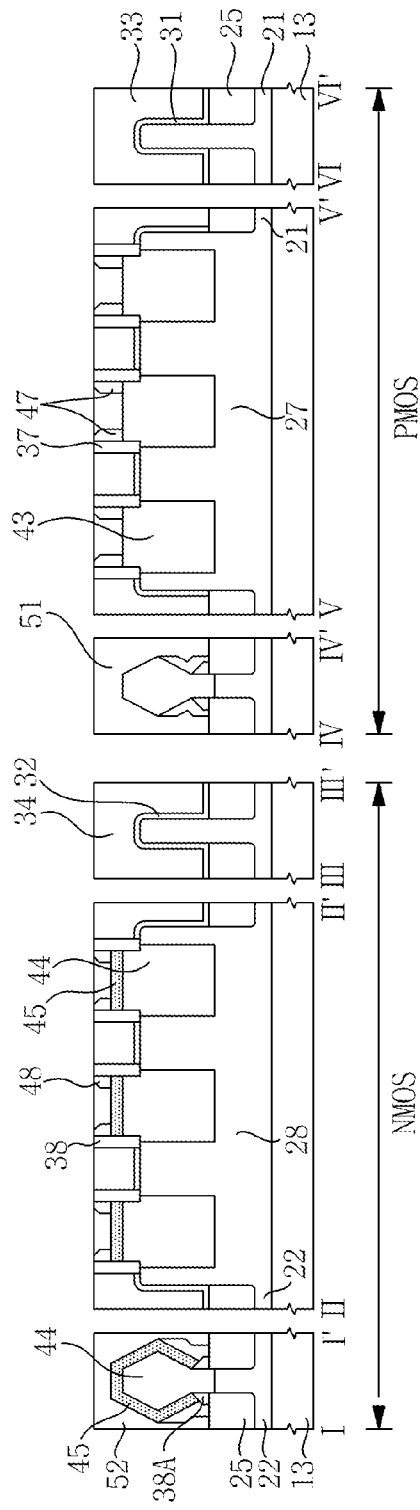

Referring to FIG. 39, the first preliminary gate pattern 33 and the second preliminary gate pattern 34 may be exposed using a CMP process. The etch-stop layer 53, the first preliminary capping pattern 35, and the second preliminary capping pattern 36 may be removed.

Figure 40:
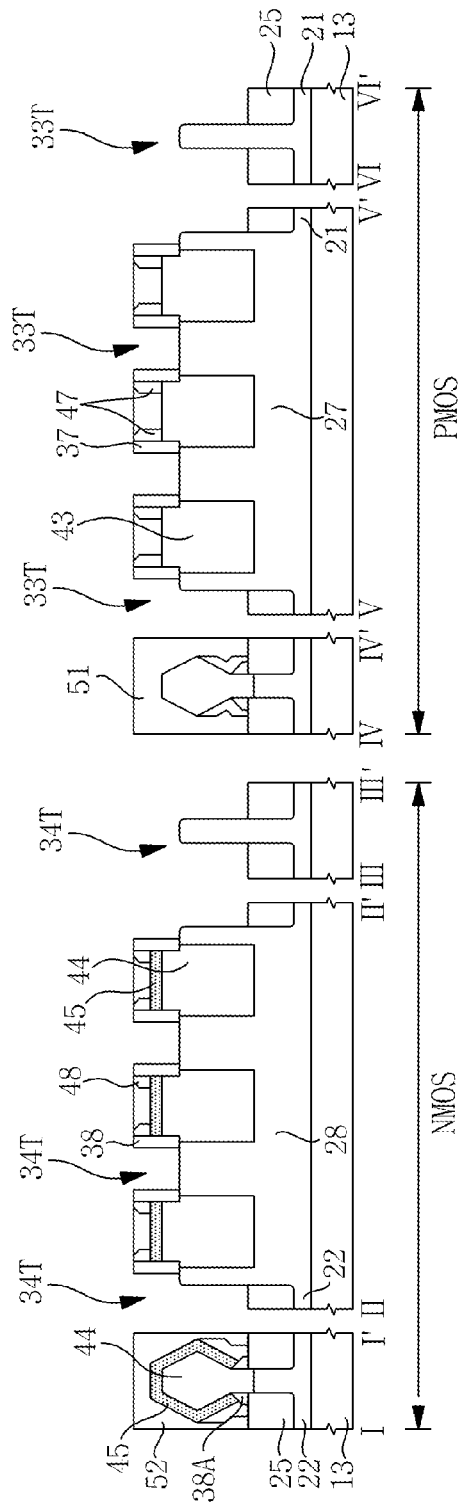

Referring to FIG. 40, a first gate trench 33T and a second gate trench 34T may be formed by removing the first preliminary gate pattern 33, the second preliminary gate pattern 34, the first preliminary buffer pattern 31, and the second preliminary buffer pattern 32. An upper surface and a side surface of the N-type fin 27 may be exposed in the first gate trench 33T. An upper surface and a side surface of the P-type fin 28 may be exposed in the second gate trench 34T.

Figure 41:
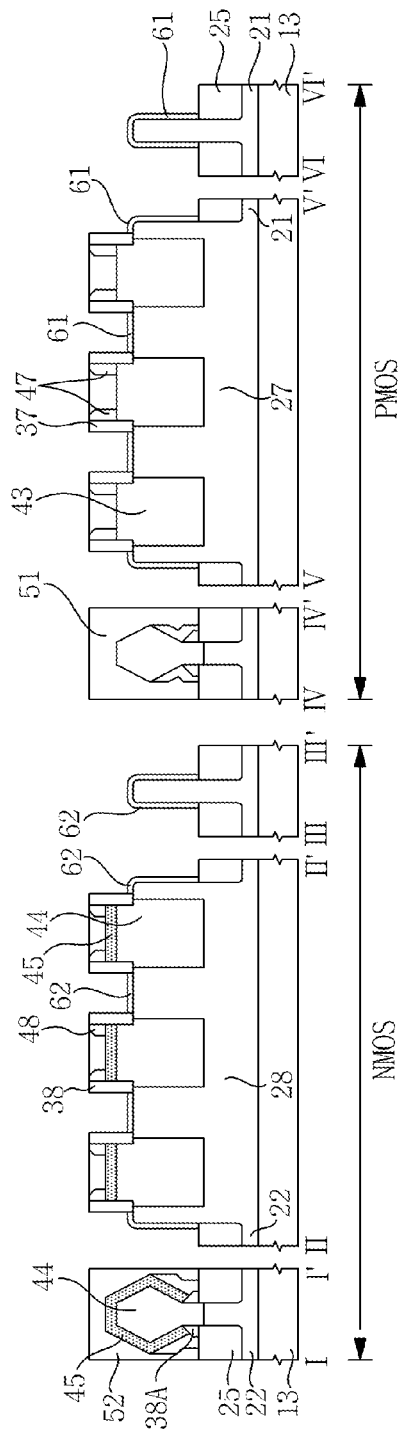

Referring to FIG. 41, a first lower gate dielectric layer 61 and a second lower gate dielectric layer 62 may be formed. The first lower gate dielectric layer 61 may be formed on the upper surface and a side surface of the N-type fin 27. The first lower gate dielectric layer 61 may be defined on the upper surface and the side surface of the N-type fin 27. The second lower gate dielectric layer 62 may be formed on the upper surface and a side surface of the P-type fin 28. The second lower gate dielectric layer 62 may be defined on the upper surface and the side surface of the P-type fin 28.

The first lower gate dielectric layer 61 and the second lower gate dielectric layer 62 may be referred to as an interfacial oxide layer, or a chemical oxide layer. The first lower gate dielectric layer 61 and the second lower gate dielectric layer 62 may be formed using a cleaning process. For example, the first lower gate dielectric layer 61 and the second lower gate dielectric layer 62 may include silicon oxide formed by a chemical reaction of Si and $H_2O_2$.

Figure 42:
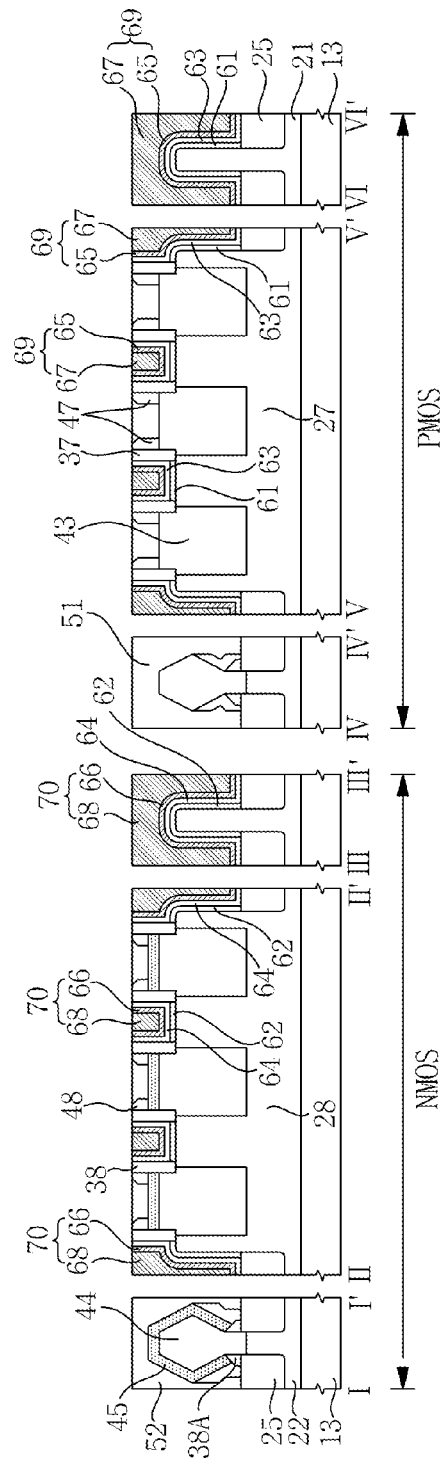

Referring to FIG. 42, a first upper gate dielectric layer 63 and a first gate electrode 69 may be formed on the first lower gate dielectric layer 61. A second upper gate dielectric layer 64 and a second gate electrode 70 may be formed on the second lower gate dielectric layer 62. The first gate electrode 69 may include a first lower gate electrode 65 and a first upper gate electrode 67. The second gate electrode 70 may include a second lower gate electrode 66 and a second upper gate electrode 68.

The first upper gate dielectric layer 63 and the second upper gate dielectric layer 64 may include silicon oxide, silicon nitride, silicon oxy-nitride, a high-K dielectric layer, or a combination thereof. For example, the first upper gate dielectric layer 63 and the second upper gate dielectric layer 64 may include HfO or HfSiO. The first upper gate dielectric layer 63 may surround a side surface and a bottom of the first gate electrode 69. The first lower gate dielectric layer 61 may be interposed between the N-type fin 27 and the first upper gate dielectric layer 63. The second upper gate dielectric layer 64 may surround a side surface and a bottom of the second gate electrode 70. The second lower gate dielectric layer 62 may be interposed between the P-type fin 28 and the second upper gate dielectric layer 64.

The first lower gate electrode 65 may surround a side surface and a bottom of the first upper gate electrode 67. The second lower gate electrode 66 may surround a side surface and a bottom of the second upper gate electrode 68. Each of the first lower gate electrode 65 and the second lower gate electrode 66 may include a conductive layer having a work-function. Each of the first lower gate electrode 65 and the second lower gate electrode 66 may include TiN, TaN, TiAl, or TiAlC. The second gate electrode 70 may include a metal layer. The first upper gate electrode 67 and the second upper gate electrode 68 may include a metal layer, a metal silicide layer, a conductive carbon layer, a polysilicon layer, or a combination thereof.

Upper surfaces of the first lower insulating layer 51, the second lower insulating layer 52, the first gate electrode 69, and the second gate electrode 70 may be exposed.

Figure 43:
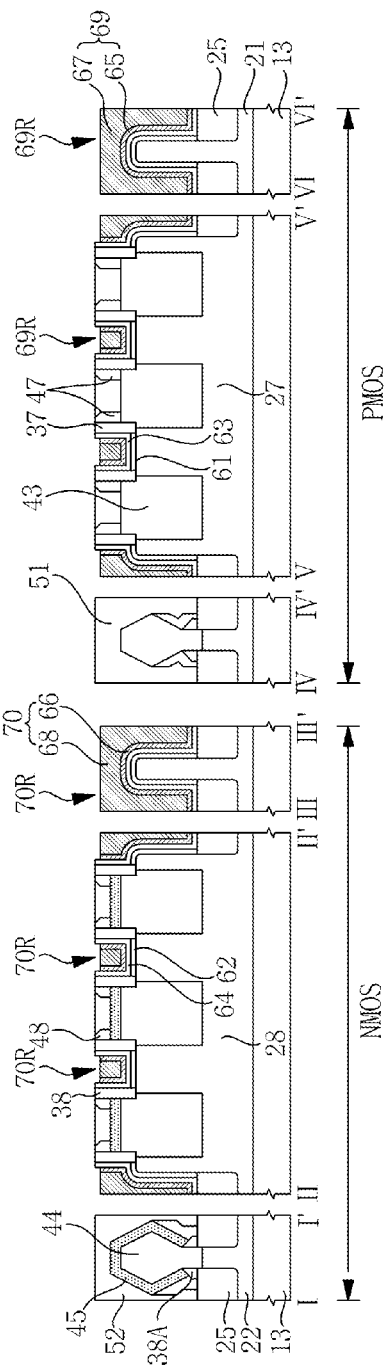

Referring to FIG. 43, a first gate recessed area 69R and a second gate recessed area 70R may be formed by performing an etch-back process on the first gate electrode 69 and the second gate electrode 70.

Figure 44:
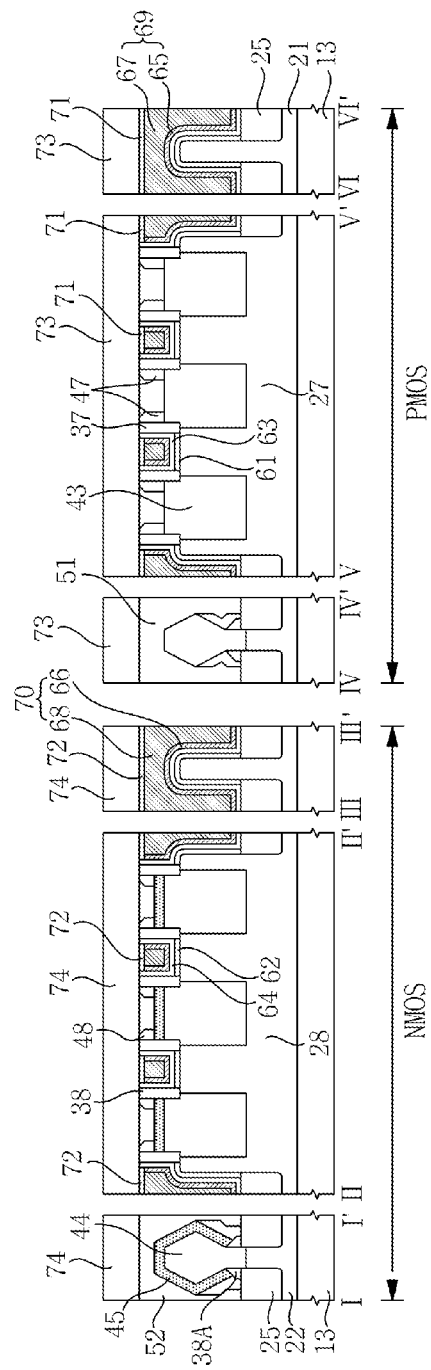

Referring to FIG. 44, a first gate capping layer 71 and a second gate capping layer 72 may be formed in the first gate recessed area 69R and the second gate recessed area 70R. A first upper insulating layer 73 may be formed in the PMOS region, and a second upper insulating layer 74 may be formed in the NMOS region.

The first gate capping layer 71 and the second gate capping layer 72 may include an insulating layer formed of silicon oxide, silicon nitride, silicon oxy-nitride, or a combination thereof. For example, the first gate capping layer 71 and the second gate capping layer 72 may include silicon nitride. The first upper insulating layer 73 and the second upper insulating layer 74 may include an insulating layer formed of silicon oxide, silicon nitride, silicon oxy-nitride, or a combination thereof. For example, the first upper insulating layer 73 and the second upper insulating layer 74 may include silicon oxide.

Figure 45:
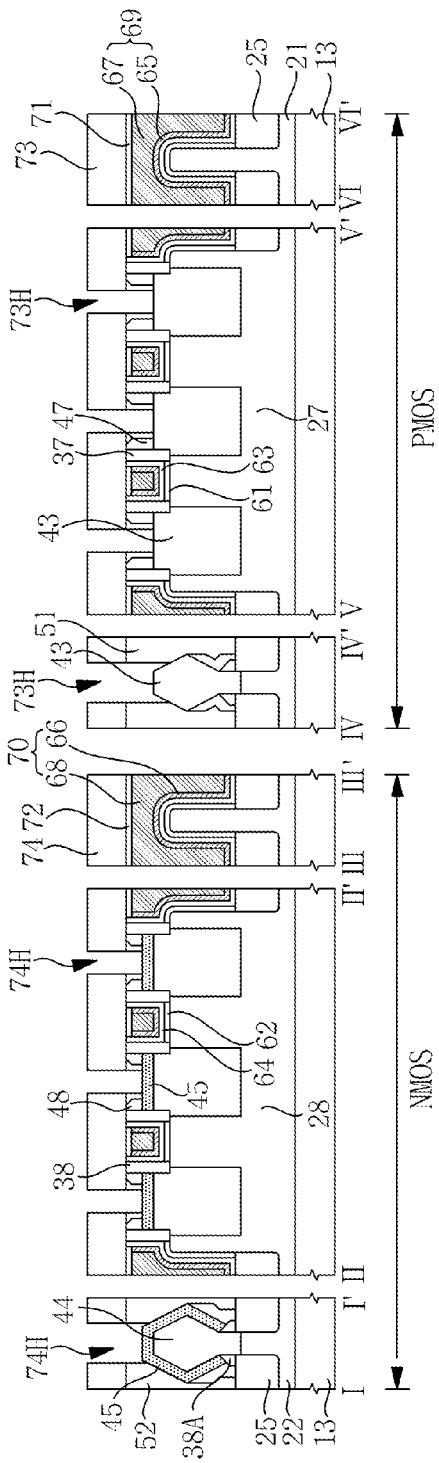

Referring to FIG. 45, a first contact hole 73H configured to expose the first source/drain 43 passing through the first upper insulating layer 73 and the first lower insulating layer 51 may be formed. A second contact hole 74H configured to expose the buffer layer 45 through the second upper insulating layer 74 and the second lower insulating layer 52 may be formed. Processes of forming the first contact hole 73H and the second contact hole 74H may be performed at the same time.

Figure 46:
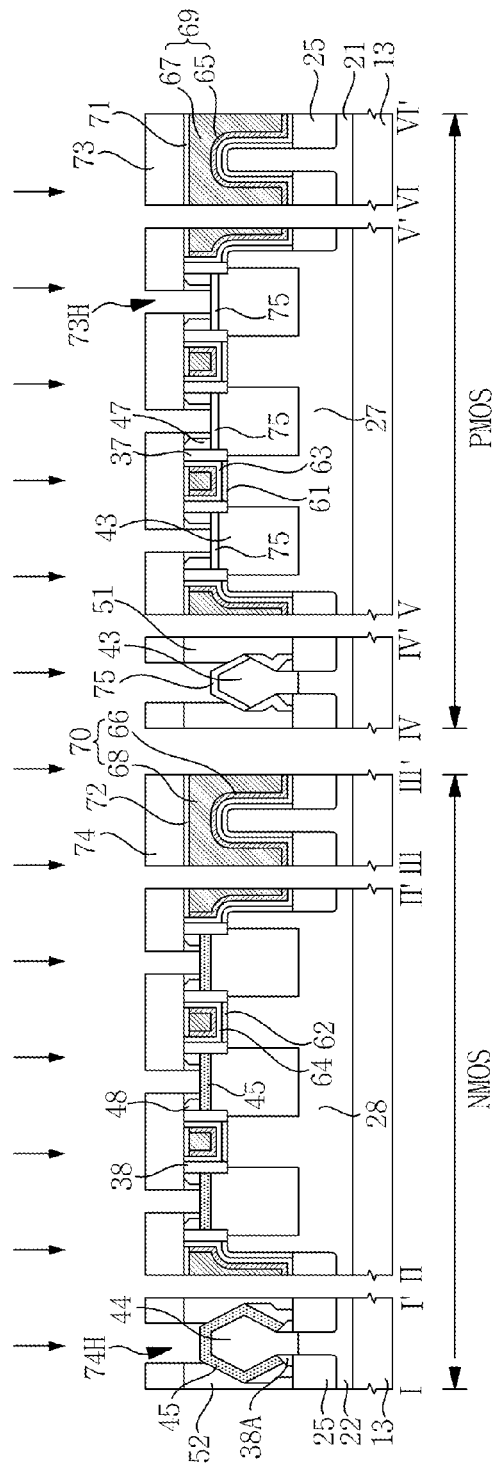

Referring to FIG. 46, a first plug ion implantation region 75 may be formed in the first source/drain 43 by implanting a P-type impurity and performing a plug ion implantation process. The first plug ion implantation region 75 may include B, BF, or a combination thereof. The buffer layer 45 may serve to prevent or inhibit the P-type impurities from implanting into the second source/drain 44 while forming the first plug ion implantation region 75. The buffer layer 45 may have a thickness greater than the first plug ion implantation region 75. The buffer layer 45 may have a thickness smaller than the second upper insulating layer 74 and the second lower insulating layer 52. A process of implanting a P-type impurity such as the plug ion implantation process may apply ion implantation energy in a range of 1 KeV to 20 KeV. P-type impurity concentration in the first plug ion implantation region 75 may be higher than that in the first source/drain 43.

Figure 47:
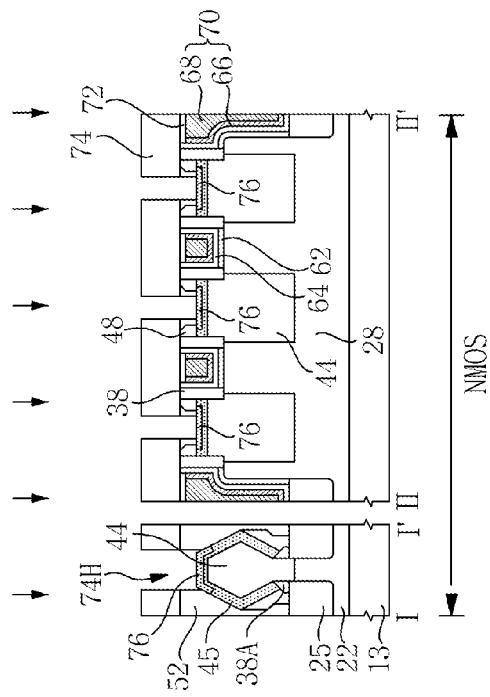

Referring to FIG. 47, in another example embodiment, a second plug ion implantation region 76 may be formed by implanting P-type impurities into the buffer layer 45 when the first plug ion implantation region 75 is formed. The second plug ion implantation region 76 may have a thickness smaller than the buffer layer 45. The buffer layer 45 may serve to prevent or inhibit the P-type impurities from implanting into the second source/drain 44.

Figure 48:
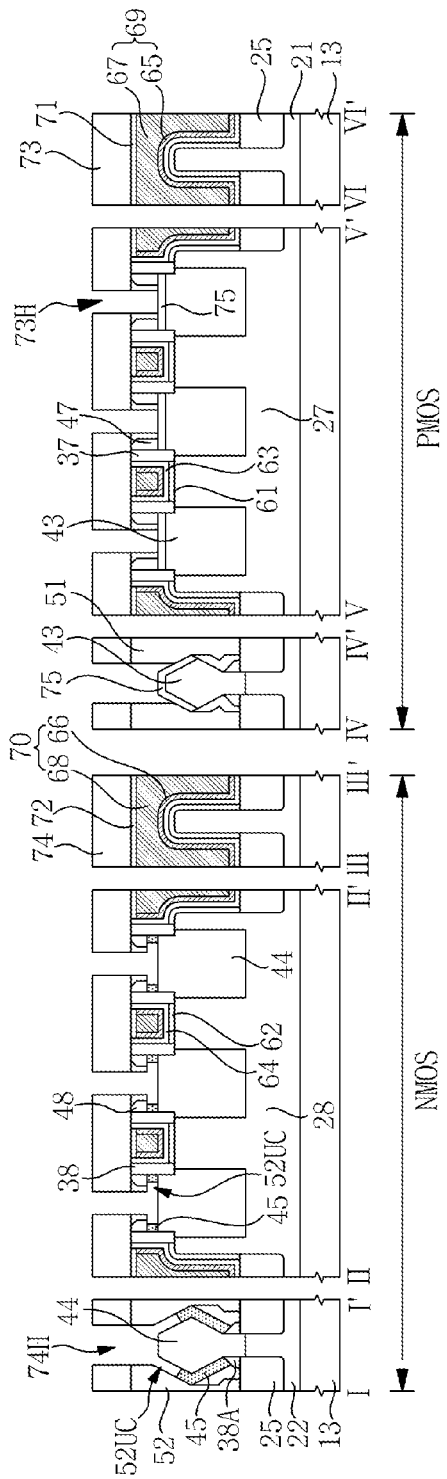

Referring to FIG. 48, the second source/drain 44 may be exposed by selectively removing the buffer layer 45. An isotropic etching process may be performed to remove the buffer layer 45. For example, a wet etching process using NH4OH, H2O2, or a combination thereof may be performed to remove the buffer layer 45. An under-cut region 52UC may be formed under the second lower insulating layer 52. The buffer layer 45 may remain between the second outer spacer 48 and the second source/drain 44.

In another example embodiment, the buffer layer 45 between the second outer spacer 48 and the second source/drain 44 may be removed. A side surface of the second inner spacer 38 may be exposed in the under-cut region 52UC.

Figure 49:
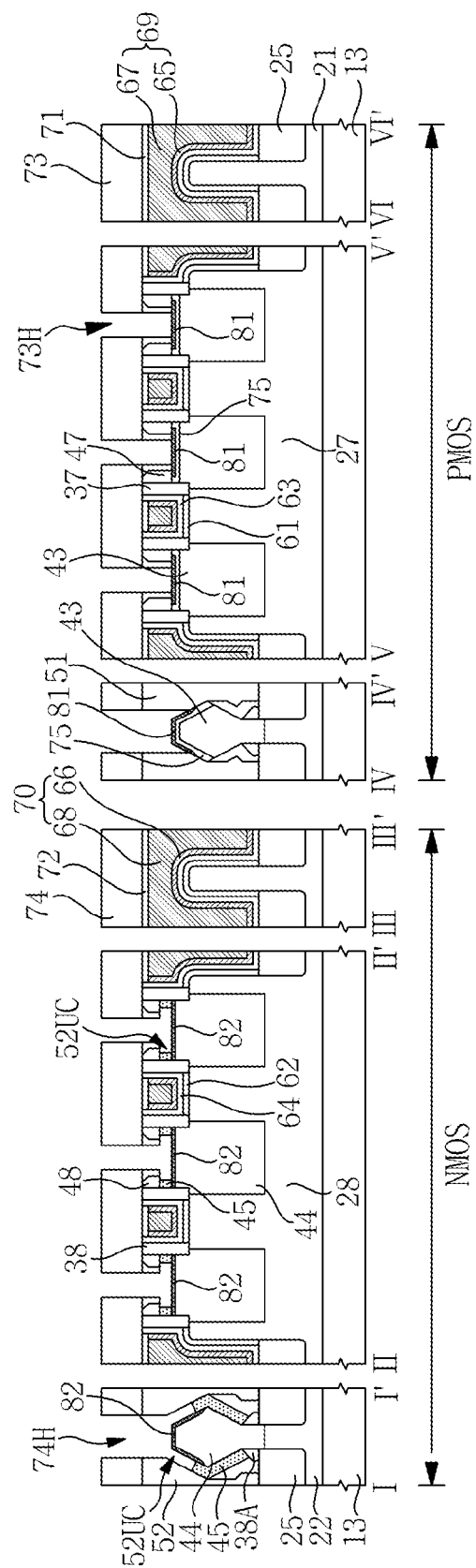

Referring to FIG. 49, a first metal silicide layer 81 and a second metal silicide layer 82 may be formed on the first source/drain 43 and the second source/drain 44, respectively. Processes of forming the first metal silicide layer 81 and the second metal silicide layer 82 may be performed at the same time.

The first metal silicide layer 81 may be formed in the first plug ion implantation region 75. The first metal silicide layer 81 may be formed along an upper surface of the first plug ion implantation region 75. The first plug ion implantation region 75 may remain between the first metal silicide layer 81 and the first source/drain 43. The second metal silicide layer 82 may directly contact the second source/drain 44.

Referring to FIG. 1 again, the first plug 87 and the second plug 88 may be formed in the first contact hole 73H and the second contact hole 74H, respectively. The first plug 87 may include the first lower conductive layer 83 and the first upper conductive layer 85. The second plug 88 may include the second lower conductive layer 84 and the second upper conductive layer 86. The first plug 87 may directly contact the first metal silicide layer 81, and the second plug 88 may directly contact the second metal silicide layer 82.

The first plug 87 and the second plug 88 may include the same material formed at the same time. The first plug 87 and the second plug 88 may include a metal layer, a metal silicide layer, a conductive carbon layer, a polysilicon layer, or a combination thereof FIGS. 50 and 51 are system block diagrams of electronic devices in accordance with the example embodiment of the inventive concepts.

Figure 50:
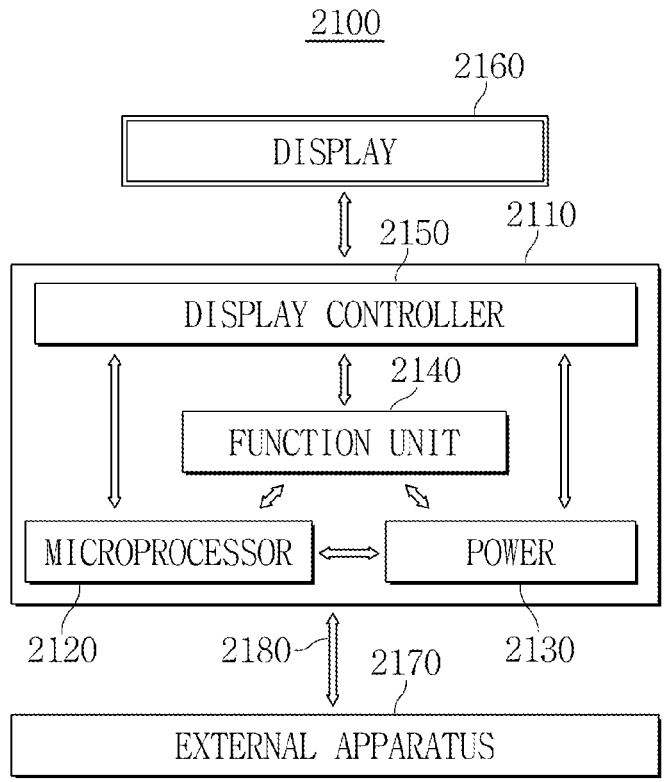
FIGS. 50 and 51 are system block diagrams of electronic devices in accordance with an example embodiment of the inventive concepts.
Figure 51:
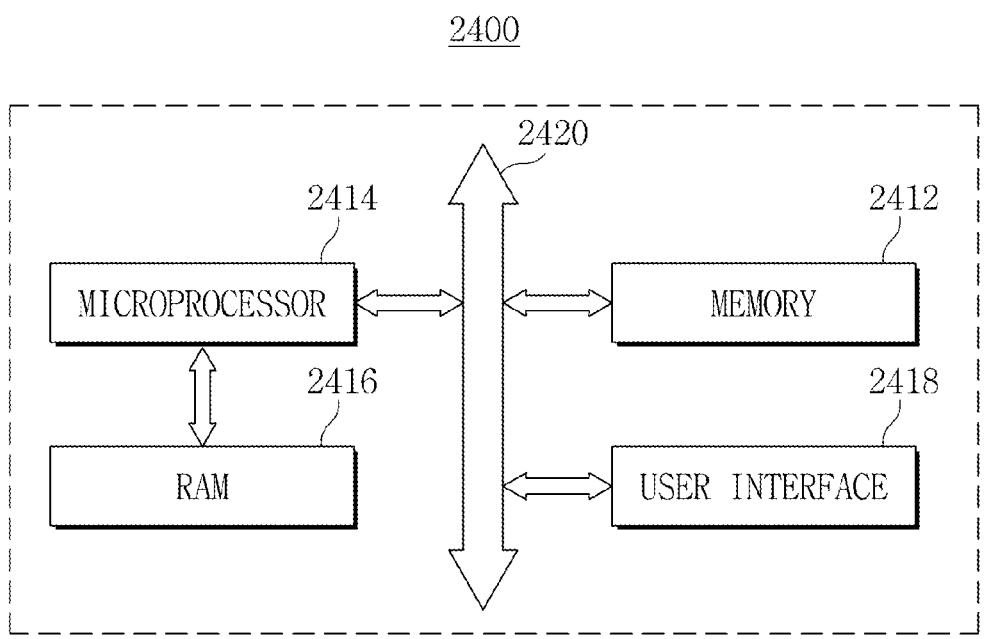

Referring to FIG. 50, a semiconductor device similar to descriptions with reference to FIGS. 1 to 49 may apply to an electronic system 2100. The electronic system 2100 may include a body 2110, a microprocessor 2120, a power 2130, a function unit 2140, and a display controller 2150. The body 2110 may include a motherboard formed with a printed circuit board (PCB). The body 2110 may include the microprocessor 2120, the power 2130, the function unit 2140, and the display controller 2150. A display 2160 may be disposed inside the body 2110 or outside the body 2110. For example, the display 2160 may be disposed on a surface of the body 2110 and display an image processed by the display controller 2150.

The power 2130 may receive a given (or, alternatively predetermined) voltage from an external battery, divide the given (or, alternatively predetermined) voltage into required voltage levels, and serve to supply the voltages to the microprocessor 2120, the function unit 2140, and the display controller 2150. The microprocessor 2120 may receive a voltage from the power 2130 and control the function unit 2140 and the display 2160. The function unit 2140 may perform various functions of the electronic system 2100. For example, when the electronic system 2100 is a smart phone, the function unit 2140 may include a dialing or various components to perform mobile functions such as an image output to the display 2160 or an audio output to a speaker from communication with an external apparatus 2170, and the function unit 2140 may also serve as a camera image processor when a camera is mounted on the smart phone.

According to an application example embodiment, when the electronic system 2100 includes a memory card or the like to expand a storage capacity, the function unit 2140 may serve as a memory card controller. The function unit 2140 may exchange a signal with the external apparatus 2170 via either a wired or wireless communication unit 2180. Furthermore, when the electronic system 2100 needs a Universal Serial Bus (USB) or the like to expand functions, the function unit 2140 may serve as an interface controller. In addition, the function unit 2140 may include a mass capacity storage unit.

A semiconductor device similar to descriptions with reference to FIGS. 1 to 49 may be applied to the function unit 2140 or the microprocessor 2120. For example, the microprocessor 2120 may include the buffer layer 45 and the first plug ion implantation region 75.

Referring to FIG. 51, an electronic system 2400 may include at least one of the semiconductor devices according to the example embodiments of the inventive concepts. The electronic system 2400 may be used for manufacturing a mobile device or a computer. For example, the electronic system 2400 may include a memory system 2412, a microprocessor 2414, a RAM 2416, a bus 2420, and a user interface 2418. The microprocessor 2414, the memory system 2412, and the user interface 2418 may be mutually connected via the bus 2420. The user interface 2418 may be used for a data input to the electronic system 2400 or a data output from the electronic system 2400. The microprocessor 2414 may program and control the electronic system 2400. The RAM 2416 may be used as an operational memory of the microprocessor 2414. The microprocessor 2414, the RAM 2416 and/or other components may be assembled in a single package. The memory system 2412 may store operational codes of the microprocessor 2414, data processed by the microprocessor 2414, or externally input data. The memory system 2412 may include a controller and a memory.

A semiconductor device similar to descriptions with reference to FIGS. 1 to 49 may apply to the microprocessor 2414, the RAM 2416, or the memory system 2412.

In accordance with example embodiments of the inventive concepts, a first plug ion implantation region, a first metal silicide layer, and a first plug are formed on a first source/drain having P-type impurities. A buffer layer is formed on a second source/drain having N-type impurities. A second metal silicide layer and a second plug are formed on the second source/drain. The second plug contacts the second metal silicide layer passing through the buffer layer. The buffer layer may serve to prevent or inhibit P-type impurities from implanting into the second source/drain while forming the first plug ion implantation region. Although processes of forming the first plug and the second plug are performed at the same time, a semiconductor device having improved electrical characteristics may be formed. A process can be simplified, and a semiconductor device can have a low-resistance contact plug.

The foregoing is illustrative of example embodiments of the inventive concepts with reference to the accompanying drawings. Although a number of example embodiments have been described, those of ordinary skill in the art will readily understand that many modifications are possible in example embodiments without materially departing from the novel teachings and advantages. Therefore, it is to be understood that the foregoing is illustrative of various example embodiments and is not to be construed as limited to the specific example embodiments disclosed.

What is claimed is:

1. A semiconductor device, comprising:
   an N-type fin and a P-type fin on a substrate;
   a first gate electrode configured to cross the N-type fin and cover a side surface of the N-type fin;
   a second gate electrode configured to cross the P-type fin and cover a side surface of the P-type fin;
   a first source/drain on the N-type fin adjacent to the first gate electrode;
   a second source/drain on the P-type fin adjacent to the second gate electrode;
   a buffer layer on a surface of the second source/drain, the buffer layer including a material different from the second source/drain;
   an interlayer insulating layer on the buffer layer and the first source/drain;
   a first plug connected to the first source/drain, the first plug passing through the interlayer insulating layer; and
   a second plug connected to the second source/drain, the second plug passing through the interlayer insulating layer and the buffer layer.

2. The semiconductor device of claim 1, wherein
   a center portion of the second source/drain has a horizontal width greater than a horizontal width of a lower portion, and
   the buffer layer directly contacts the lower portion of the second source/drain.

3. The semiconductor device of claim 1, wherein the buffer layer includes a crystal growth material.

4. The semiconductor device of claim 1, wherein the buffer layer includes germanium (Ge).

5. The semiconductor device of claim 1, further comprising:
   a plug ion implantation region between the first source/drain and the first plug,
   wherein a P-type impurity concentration in the plug ion implantation region is greater than a P-type impurity concentration in the first source/drain.

6. The semiconductor device of claim 5, wherein the buffer layer has a thickness greater than the plug ion implantation region.

7. The semiconductor device of claim 1, wherein
   a thickness of the buffer layer is 3 nm or more, and
   the thickness of the buffer layer is smaller than a thickness of the interlayer insulating layer.

8. The semiconductor device of claim 1, wherein
   the first source/drain includes at least one of silicon germanium (SiGe), silicon (Si), boron (B) and boron monofluoride (BF), and
   the second source/drain includes at least one of silicon carbide (SiC), silicon (Si), phosphorus (P) and arsenic (As).

9. The semiconductor device of claim 1, wherein a lower portion of the second plug has a horizontal width greater than a horizontal width of a center portion.

10. The semiconductor device of claim 1, further comprising:
an under-cut region under the interlayer insulating layer,
wherein the second plug extends into the under-cut region and contacts the buffer layer.

11. The semiconductor device of claim 1, further comprising:
a first metal silicide layer between the first plug and the first source/drain; and
a second metal silicide layer between the second plug and the second source/drain.

12. A semiconductor device, comprising:
a first fin on a substrate, the first fin having a first conductivity type;
a first gate electrode configured to cross the first fin and cover a side surface of the first fin;
a first source/drain on the first fin and adjacent to the first gate electrode, the first source/drain having a second conductivity type different from the first conductivity type;
a buffer layer on a surface of the first source/drain, the buffer layer including a material different from the first source/drain;
an interlayer insulating layer on the buffer layer; and
a first plug connected to the first source/drain, the first plug passing through the interlayer insulating layer and the buffer layer.

13. The semiconductor device of claim 12, further comprising:
a second fin spaced apart from the first fin on the substrate, the second fin having the second conductivity type;
a second gate electrode configured to cross the second fin and cover a side surface of the second fin;
a second source/drain on the second fin and adjacent to the second gate electrode, the second source/drain having the first conductivity type; and
a second plug connected to the second source/drain, the second plug passing through the interlayer insulating layer,
wherein the interlayer insulating layer is on the second source/drain.

14. The semiconductor device of claim 13, further comprising:
a plug ion implantation region between the second source/drain and the second plug.

15. The semiconductor device of claim 14, wherein the buffer layer has a thickness greater than the plug ion implantation region.

16. A semiconductor device, comprising:
a plurality of first fins on a substrate and in parallel, the plurality of first fins having a first conductivity type;
a first gate electrode configured to cross the first fins and cover side surfaces of the first fins;
first source/drains on the first fins and adjacent to the first gate electrode, the first source/drains having a second conductivity type different from the first conductivity type;
a buffer layer on a surface of the first source/drains, the buffer layer including a material different from the first source/drains;
an interlayer insulating layer on the buffer layer; and
a first plug connected to the first source/drains, the first plug passing through the interlayer insulating layer and the buffer layer.

17. The semiconductor device of claim 16, further comprising:
a plurality of second fins spaced apart from the first fins on the substrate and in parallel, the second fins having the second conductivity type;
a second gate electrode configured to cross the second fins and cover side surfaces of the second fins;
second source/drains on the second fins and adjacent to the second gate electrode, the second source/drains having the first conductivity type; and
a second plug connected to the second source/drains, the second plug passing through the interlayer insulating layer,
wherein the interlayer insulating layer is on the second source/drains.

18. The semiconductor device of claim 17, further comprising:
a plug ion implantation region between the second source/drains and the second plug.

19. The semiconductor device of claim 18, wherein the buffer layer has a thickness greater than the plug ion implantation region.

20. The semiconductor device of claim 12, wherein the buffer layer includes germanium (Ge).

* * * * *